US012813199B2

(12) United States Patent

Seyama

(10) Patent No.: US 12,813,199 B2
(45) Date of Patent: *Nov. 24, 2026

(54) MOUNTING APPARATUS, MOUNTING METHOD, AND RECORDING MEDIUM

(71) Applicant: Yamaha Robotics Co., Ltd., Tokyo (JP)

(72) Inventor: Kohei Seyama, Tokyo (JP)

(73) Assignee: Yamaha Robotics Co., Ltd., Tokyo (JP)

( * ) Notice: Subject to any disclaimer, the term of this patent is extended or adjusted under 35 U.S.C. 154(b) by 301 days.

This patent is subject to a terminal disclaimer.

(21) Appl. No.: 18/710,616

(22) PCT Filed: Nov. 16, 2021

(86) PCT No.: PCT/JP2021/042050

§ 371 (c)(1),
(2) Date: May 16, 2024

(87) PCT Pub. No.: WO2023/089657

PCT Pub. Date: May 25, 2023

(65) Prior Publication Data

US 2025/0014921 A1 Jan. 9, 2025

(51) Int. Cl.
*H10P 72/00* (2026.01)
*G06T 7/00* (2017.01)

(52) U.S. Cl.
CPC .......... *H10P 72/0446* (2026.01); *G06T 7/001* (2013.01); *G06T 2207/30148* (2013.01)

(58) Field of Classification Search
None
See application file for complete search history.

(56) References Cited

U.S. PATENT DOCUMENTS

| | | | | |
|---|---|---|---|---|
| 2009/0185183 | A1* | 7/2009 | Zangooie | H10P 72/53 73/1.01 |
| 2017/0154864 | A1 | 6/2017 | Hayata et al. | |
| 2020/0177866 | A1* | 6/2020 | Myokan | H04N 13/246 |

FOREIGN PATENT DOCUMENTS

| | | |
|---|---|---|
| JP | 2010238974 X | 10/2010 |
| JP | 2014179560 | 9/2014 |

(Continued)

OTHER PUBLICATIONS

"International Search Report (Form PCT/ISA/210) of PCT/JP2021/042050", mailed on Feb. 1, 2022, with English translation thereof, pp. 1-4.

*Primary Examiner* — Paul B Yanchus, III
(74) *Attorney, Agent, or Firm* — JCIPRNET

(57) ABSTRACT

A mounting apparatus includes a mounting tool; top-view imaging units employing Scheimpflug optical systems for imaging from above a substrate; a bottom-view imaging unit for imaging from below a mounting body held by the mounting tool; a calibration controller calculating calibration values for calibrating a difference between coordinate values calculated based on top-view images and a bottom-view image, based on the top-view images and the bottom-view image of imaging the same calibration index; and a mounting controller recognizing a reference position of the mounting body based on the bottom-view image of the bottom-view imaging unit imaging the mounting body held by the mounting tool, and causing the mounting tool to place and mount the mounting body on the substrate so that the reference position coincides with a target position determined based on the top-view images of the top-view imaging units imaging the substrate and the calibration values.

10 Claims, 17 Drawing Sheets

(56) References Cited

FOREIGN PATENT DOCUMENTS

| | | |
|---|---|---|
| JP | 2016092094 | 5/2016 |
| WO | 2015190471 | 12/2015 |

* cited by examiner

MOUNTING APPARATUS, MOUNTING METHOD, AND RECORDING MEDIUM

CROSS-REFERENCE TO RELATED APPLICATION

This application is a 371 application of the International PCT application serial no. PCT/JP2021/042050, filed on Nov. 16, 2021. The entirety of the above-mentioned patent application is hereby incorporated by reference herein and made a part of this specification.

TECHNICAL FIELD

The present invention relates to a mounting apparatus, a mounting method, and a mounting control program.

RELATED ART

In a bonding apparatus, which is an example of the conventional mounting apparatus, first, a work target such as a die pad is imaged from directly above with a camera to confirm the position thereof. Then, after retracting the camera, a head portion supporting a bonding tool is moved directly above the work target, and the bonding work is performed. The bonding apparatus employing such a configuration not only takes time to work but also has a problem of accumulation of movement errors with respect to the work target position. Therefore, it has been considered to use an imaging unit employing a Scheimpflug optical system that is capable of imaging the work target from an oblique direction (see, for example, Patent Literature 1).

CITATION LIST

Patent Literature

[Patent Literature 1] Japanese Patent Laid-Open No. 2014-179560

SUMMARY OF INVENTION

Technical Problem

However, it has been found that, due to structural characteristics of the optical system, minute displacements of the optical system elements due to a temperature change in the surrounding environment are likely to appear as displacements of the output image in the plane direction in the imaging unit employing a Scheimpflug optical system. The displacements of the output image in the plane direction cause an error in calculating the target position where the semiconductor chip should be placed, and consequently result in impeding the accurate mounting of the semiconductor chip on the original target position.

The present invention was made to solve such problems, and the present invention provides a mounting apparatus, etc. that is capable of accurately determining a target position for placing a mounting body such as a semiconductor chip by using an imaging unit that employs a Scheimpflug optical system, and placing and mounting the mounting body at the target position on a substrate even if the temperature of the surrounding environment changes.

Solution to Problem

A mounting apparatus according to the first aspect of the present invention includes: a mounting tool picking up and holding a mounting body, and placing and mounting the mounting body on a substrate placed on a stage; top-view imaging units, in which respective optical systems and imaging elements are arranged to satisfy a Scheimpflug condition so that a plane parallel to a stage surface of the stage becomes a focal plane, for imaging from above the substrate from the same side as the mounting tool with respect to the stage surface; a bottom-view imaging unit for imaging from below the mounting body that is in a state of being held by the mounting tool from a side opposite to the top-view imaging units with respect to the stage surface; a calibration controller calculating calibration values for calibrating a difference between coordinate values calculated based on top-view images output by the top-view imaging units and coordinate values calculated based on a bottom-view image output by the bottom-view imaging unit, based on the top-view images output by the top-view imaging units by imaging a preset calibration index and the bottom-view image output by the bottom-view imaging unit by imaging the calibration index; and a mounting controller recognizing a reference position of the mounting body based on the bottom-view image output by the bottom-view imaging unit by imaging the mounting body held by the mounting tool, and causing the mounting tool to place and mount the mounting body on the substrate so that the reference position coincides with a target position determined based on the top-view images output by the top-view imaging units by imaging the substrate and the calibration values.

Further, a mounting method according to the second aspect of the present invention is provided for a mounting body using a mounting apparatus, which includes a mounting tool picking up and holding the mounting body and placing and mounting the mounting body on a substrate placed on a stage; top-view imaging units in which respective optical systems and imaging elements are arranged to satisfy a Scheimpflug condition so that a plane parallel to a stage surface of the stage becomes a focal plane, for imaging from above the substrate from the same side as the mounting tool with respect to the stage surface; and a bottom-view imaging unit for imaging from below the mounting body that is in a state of being held by the mounting tool from a side opposite to the top-view imaging units with respect to the stage surface. The mounting method includes: a calibration control step of calculating calibration values for calibrating a difference between coordinate values calculated based on top-view images output by the top-view imaging units and coordinate values calculated based on a bottom-view image output by the bottom-view imaging unit, based on the top-view images output by the top-view imaging units by imaging a preset calibration index and the bottom-view image output by the bottom-view imaging unit by imaging the calibration index; and a mounting control step of recognizing a reference position of the mounting body based on the bottom-view image output by the bottom-view imaging unit by imaging the mounting body held by the mounting tool, and causing the mounting tool to place and mount the mounting body on the substrate so that the reference position coincides with a target position determined based on the top-view images output by the top-view imaging units by imaging the substrate and the calibration values.

Further, a mounting control program according to the third aspect of the present invention is provided for controlling a mounting apparatus, which includes a mounting tool picking up and holding a mounting body and placing and mounting the mounting body on a substrate placed on a stage; top-view imaging units in which respective optical systems and imaging elements are arranged to satisfy a Scheimpflug condition so that a plane parallel to a stage surface of the stage becomes a focal plane, for imaging from above the substrate from the same side as the mounting tool with respect to the stage surface; and a bottom-view imaging unit for imaging from below the mounting body that is in a state of being held by the mounting tool from a side opposite to the top-view imaging units with respect to the stage surface. The mounting control program causes a computer to execute: a calibration control step of calculating calibration values for calibrating a difference between coordinate values calculated based on top-view images output by the top-view imaging units and coordinate values calculated based on a bottom-view image output by the bottom-view imaging unit, based on the top-view images output by the top-view imaging units by imaging a preset calibration index and the bottom-view image output by the bottom-view imaging unit by imaging the calibration index; and a mounting control step of recognizing a reference position of the mounting body based on the bottom-view image output by the bottom-view imaging unit by imaging the mounting body held by the mounting tool, and causing the mounting tool to place and mount the mounting body on the substrate so that the reference position coincides with a target position determined based on the top-view images output by the top-view imaging units by imaging the substrate and the calibration values.

Effects of Invention

According to the present invention, it is possible to provide a mounting apparatus, etc. that is capable of accurately determining the target position for placing the mounting body such as a semiconductor chip by using the imaging unit that employs a Scheimpflug optical system, and placing and mounting the mounting body at the target position on the substrate even if the temperature of the surrounding environment changes.

DESCRIPTION OF EMBODIMENTS

Figure 1:
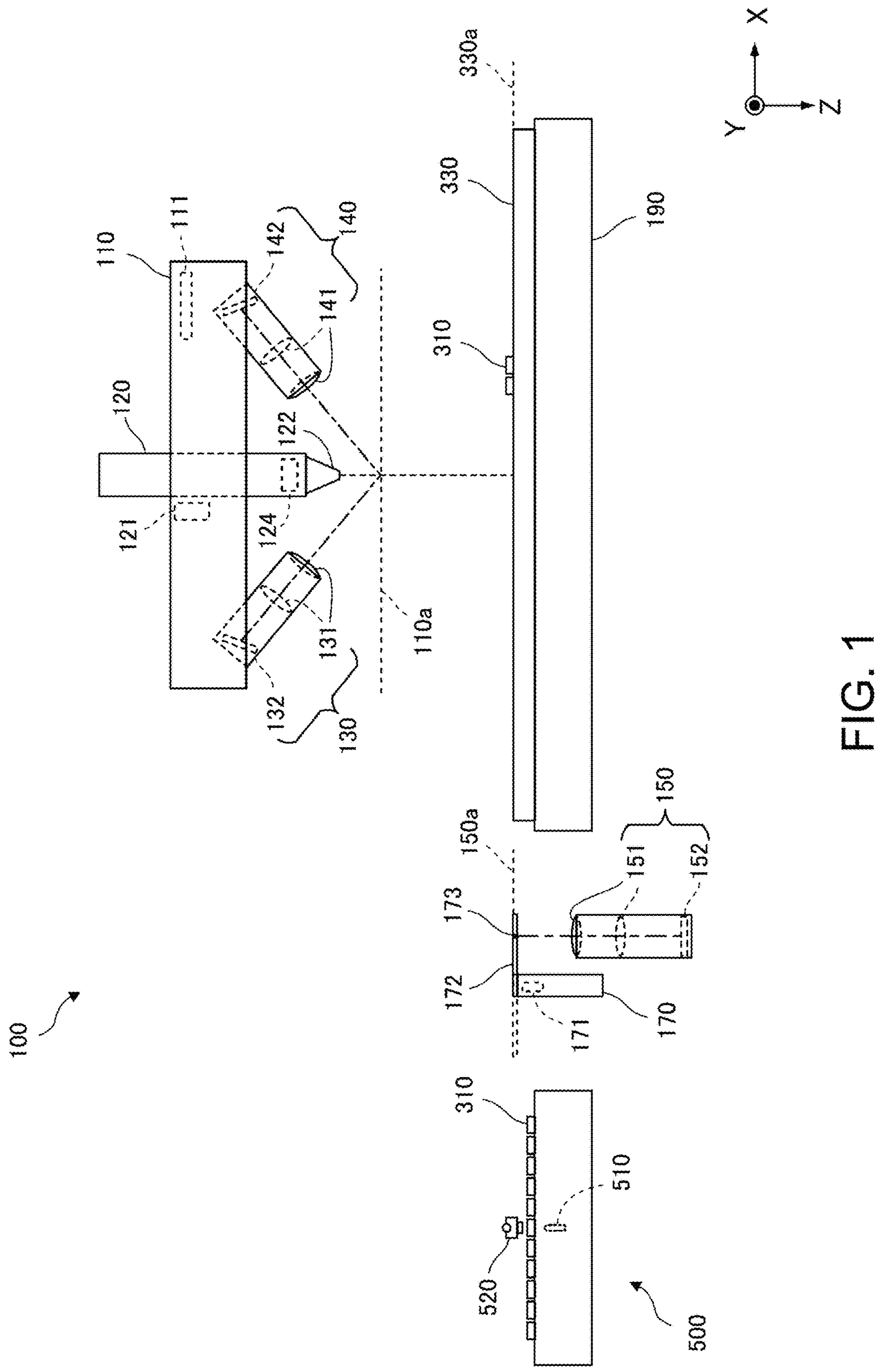
FIG. 1 is an overall configuration diagram of the flip chip bonder including the bonding apparatus according to this embodiment.

Hereinafter, the present invention will be described through embodiments of the invention, but the invention according to the scope of the claims is not limited to the following embodiments. Moreover, not all the configurations described in the embodiments are essential as means for solving the problems. In each drawing, when there are multiple structures with the same or similar configurations, some may be given reference numerals and the same reference numerals may be omitted for others in order to avoid complication.

FIG. 1 is an overall configuration diagram of a flip chip bonder including a bonding apparatus 100 as a mounting apparatus according to this embodiment. The flip chip bonder is mainly composed of the bonding apparatus 100 and a chip supply apparatus 500. The chip supply apparatus 500 is an apparatus that places a diced semiconductor chip 310 as a mounting body on the upper surface and supplies the diced semiconductor chip 310 to the bonding apparatus 100. Specifically, chip supply apparatus 500 includes a pickup mechanism 510 and a reversing mechanism 520. The pickup mechanism 510 is a device that pushes up any placed semiconductor chip 310 toward the reversing mechanism 520. The reversing mechanism 520 is a device that sucks and reverses the semiconductor chip 310 pushed up by the pickup mechanism 510 to change the orientation thereof in the up-and-down direction. The bonding apparatus 100 is an apparatus that picks up the semiconductor chip 310, which is sucked while being reversed by the reversing mechanism 520, with a bonding tool 120, which will be described later, and places and bonds the semiconductor chip 310 to a target position on a lead frame 330. The lead frame 330 is an example of a substrate placed on a stage 190.

The bonding apparatus 100 mainly includes a head portion 110, the bonding tool 120, a first imaging unit 130, a second imaging unit 140, a third imaging unit 150, a calibration unit 170, and the stage 190. The head portion 110 supports the bonding tool 120, the first imaging unit 130, and the second imaging unit 140, and is movable in the plane direction and the vertical direction by a head drive motor 111. In this embodiment, the plane direction is the horizontal direction defined by the X-axis direction and the Y-axis direction, and the vertical direction (height direction) is the Z-axis direction orthogonal to the X-axis direction and the Y-axis direction, as shown in the drawing.

The bonding tool 120 is movable in the height direction with respect to the head portion 110 by a tool drive motor 121. The bonding tool 120 is an example of the mounting tool, and has a collet 122 for sucking the semiconductor chip 310 at the tip portion and a heater 124 for heating the semiconductor chip 310 sucked by the collet 122. The bonding tool 120 places the semiconductor chip 310 sucked by the collet 122 at a predetermined position set on a planned placement surface 330*a* of the lead frame 330 placed on the stage 190, and heats and bonds the semiconductor chip 310 with the heater 124 while applying pressure with the tip portion of the collet 122.

The first imaging unit 130 and the second imaging unit 140 are top-view imaging units for imaging the lead frame 330 from above. The first imaging unit 130 includes a first optical system 131 and a first imaging element 132, and is obliquely provided on the head portion 110 with the optical axis thereof directed downward from the bonding tool 120. The first optical system 131 and the first imaging element 132 are arranged to satisfy a Scheimpflug condition so that a plane parallel to the stage surface of the stage 190 becomes a focal plane 110*a*.

The second imaging unit 140 includes a second optical system 141 and a second imaging element 142, and is obliquely provided on the head portion 110 on the side opposite to the first imaging unit 130 with respect to the bonding tool 120 with the optical axis thereof directed downward from the bonding tool 120. The second optical system 141 and the second imaging element 142 are arranged to satisfy the Scheimpflug condition so that a plane parallel to the stage surface of the stage 190 becomes the focal plane 110*a*. In the following description, the first imaging unit 130 and the second imaging unit 140 may be collectively referred to as the "top-view imaging units."

The third imaging unit 150 is a bottom-view imaging unit for imaging the semiconductor chip in a state of being held by the collet 122 of the bonding tool 120 from below. As shown in the drawing, the third imaging unit 150 is arranged in a space on the side opposite to the space in which the top-view imaging units are arranged when the stage surface of the stage 190 is taken as a dividing surface.

The third imaging unit 150 includes a third optical system 151 and a third imaging element 152, and is installed with the optical axis thereof directed upward. The third imaging unit 150 is a general imaging unit in which the third optical system 151 and the third imaging element 152 are arranged to be orthogonal to the optical axis, and a focal plane 150*a* thereof is parallel to the light receiving surface of the third imaging element 152. In addition, the focal plane 150*a* is set to coincide with the planned placement surface 330*a* of the lead frame 330. In other words, the third imaging unit 150 is arranged at a predetermined position of the bonding apparatus 100 so that the focal plane 150*a* thereof coincides with the planned placement surface 330*a*. The third optical system 151 takes a certain depth range sandwiching the focal plane 150*a* as the depth of field. Accordingly, in the installation adjustment for matching the focal plane 150*a* with the planned placement surface 330*a*, a deviation is allowed within the range of the depth of field $D_P$. In addition, in the following description, the third imaging unit 150 may be referred to as the "bottom-view imaging unit."

The calibration unit 170 mainly includes an index drive motor 171, an index plate 172, and a calibration index 173. The calibration index 173 is a reference mark with a defined reference position, for example, the intersection of a cross mark. The index plate 172 is, for example, a thin plate of glass or transparent resin, and has the calibration index 173 printed on one surface thereof. That is, the calibration index 173 can be observed from either side of the index plate 172. If two calibration indices 173 are respectively printed on both sides of the index plate 172 without any deviation in the reference positions in the XY directions, the index plate 172 does not need to be transparent. In that case, the thickness of the index plate 172 is set so that the calibration index 173 facing the third imaging unit 150 falls within the range of the depth of field $D_P$ of the third imaging unit 150. Further, the calibration index 173 may be provided not only by printing but also by attaching a sticker, scribing the surface of the index plate 172, or the like.

The index drive motor 171 rotates the index plate 172 around the Z-axis to move the calibration index 173 near the center of the field of view of the third imaging unit 150 or retract the calibration index 173 from the field of view. In this embodiment, the calibration index 173 is printed on the surface of the index plate 172 on the side opposite to the surface facing the third imaging unit 150. Then, when the calibration index 173 is moved near the center of the field of view of the third imaging unit 150, the printed surface is adjusted so that the planned placement surface 330*a* of the lead frame 330 and the focal plane 150*a* of the third imaging unit 150 fall on the same plane.

Figure 2:
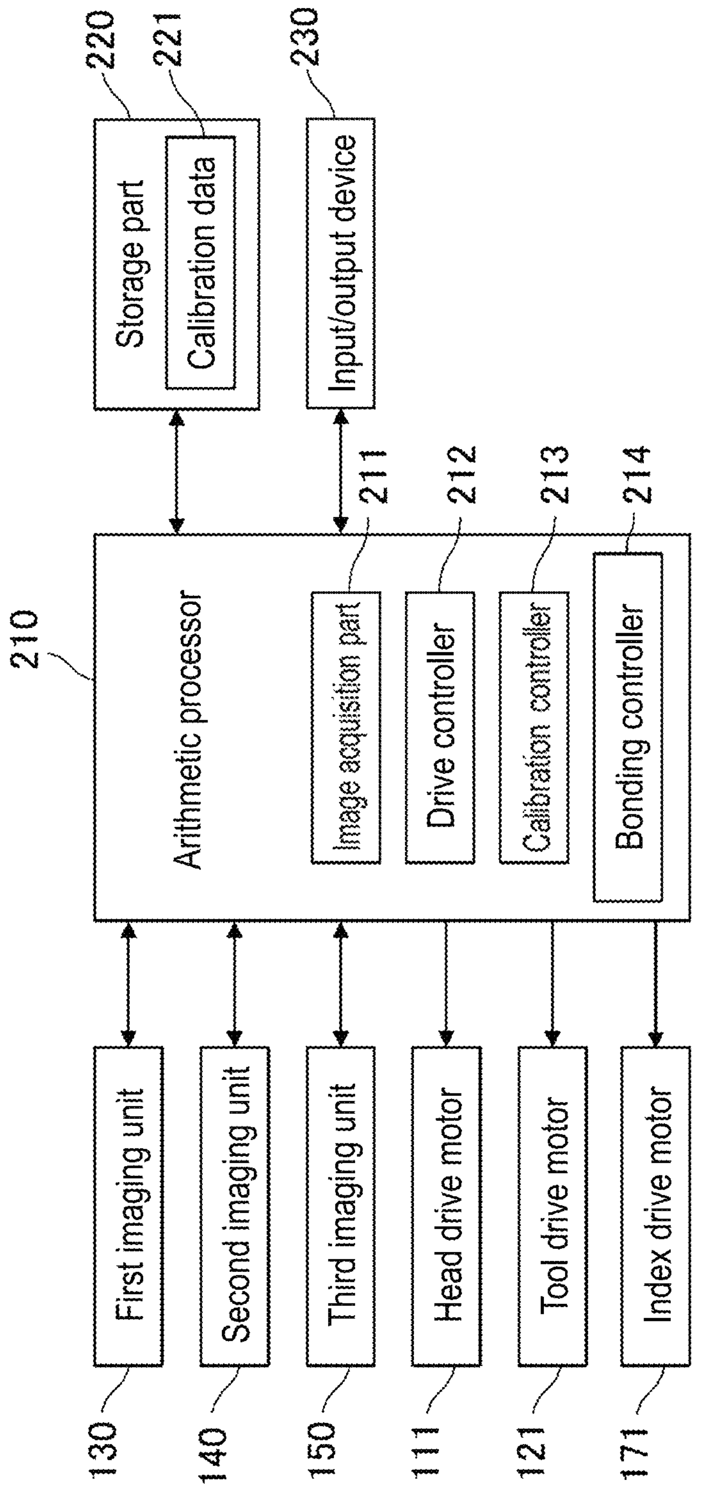
FIG. 2 is a system configuration diagram of the bonding apparatus.

FIG. 2 is a system configuration diagram of the bonding apparatus 100. A control system of the bonding apparatus 100 is mainly composed an arithmetic processor 210, a storage part 220, an input/output device 230, the first imaging unit 130, the second imaging unit 140, the third imaging unit 150, the head drive motor 111, the tool drive motor 121, and the index drive motor 171.

The arithmetic processor 210 is a processor (CPU: Central Processing Unit) that performs control over the bonding apparatus 100 and processing of execution of programs. The processor may be configured to cooperate with an arithmetic processing chip such as an ASIC (Application Specific Integrated Circuit) and a GPU (Graphics Processing Unit). The arithmetic processor 210 reads out a bonding control program stored in the storage part 220 and executes various processes related to bonding control.

The storage part 220 is a non-volatile storage medium, and is configured by, for example, an HDD (Hard Disk Drive). In addition to the bonding control program, the storage part 220 can store various parameter values, functions, lookup tables, etc. used for control and calculation. The storage part 220 particularly stores calibration data 221. The calibration data 221 will be specifically described later, and the calibration data 221 is data related to calibration values for calibrating a difference between the coordinate values calculated based on the top-view image and the coordinate values calculated based on the bottom-view image for the same observation target.

The input/output device 230 includes, for example, a keyboard, a mouse, and a display monitor, and is a device that accepts a menu operation performed by the user and presents information to the user. For example, the arithmetic processor 210 may display the acquired top-view image or bottom-view image on the display monitor, which is one of the input/output device 230.

The first imaging unit 130 receives an imaging request signal from the arithmetic processor 210 and performs imaging, and transmits the first top-view image output by the first imaging element 132 to the arithmetic processor 210 as an image signal. The second imaging unit 140 receives an imaging request signal from the arithmetic processor 210 and performs imaging, and transmits the second top-view image output by the second imaging element 142 to the arithmetic processor 210 as an image signal. The third imaging unit 150 receives an imaging request signal from the arithmetic processor 210 and performs imaging, and transmits the bottom-view image output by the third imaging element 152 to the arithmetic processor 210 as an image signal.

The head drive motor 111 receives a drive signal from the arithmetic processor 210 and moves the head portion 110 in the horizontal plane direction and the height direction. The tool drive motor 121 receives a drive signal from the arithmetic processor 210 and moves the bonding tool 120 in the height direction and rotates the bonding tool 120 around the Z-axis. The index drive motor 171 receives a drive signal from the arithmetic processor 210 and rotates the index plate 172.

The arithmetic processor 210 also plays a role as a functional arithmetic part that executes various calculations according to the processing instructed by the bonding control program. The arithmetic processor 210 can function as an image acquisition part 211, a drive controller 212, a calibration controller 213, and a bonding controller 214. The image acquisition part 211 transmits the imaging request signals to the first imaging unit 130, the second imaging unit 140, and the third imaging unit 150, and acquires the image signals of the first top-view image, the second top-view image, and the bottom-view image. The drive controller 212 moves the head portion 110, the bonding tool 120, and the index plate 172 to the target positions by transmitting the drive signals corresponding to the control amounts to the head drive motor 111, the tool drive motor 121, and the index drive motor 171. In addition, by transmitting drive signals to the pickup mechanism 510 and the reversing mechanism 520, the semiconductor chip 310 serving as the target is pushed up or sucked and reversed.

The calibration controller 213 controls the image acquisition part 211, the drive controller 212, etc. to calculate the above-mentioned calibration values based on the top-view images of the calibration index 173 imaged and output by the top-view imaging units and the bottom-view image imaged and output by the bottom-view imaging unit. The bonding controller 214 is an example of the mounting controller, and controls the image acquisition part 211, the drive controller 212, etc. to recognize the reference position of the semiconductor chip 310 based on the bottom-view image output by the bottom-view imaging unit by imaging the semiconductor chip 310 held by the bonding tool 120. Then, the semiconductor chip 310 is placed and bonded to the lead frame 330 by the bonding tool 120 so that the reference position coincides with the target position determined based on the top-view images output by the top-view imaging units by imaging the lead frame 330 and the calibration values. Specific control and processing of the calibration controller 213 and the bonding controller 214 will be described in detail later.

Figure 3:
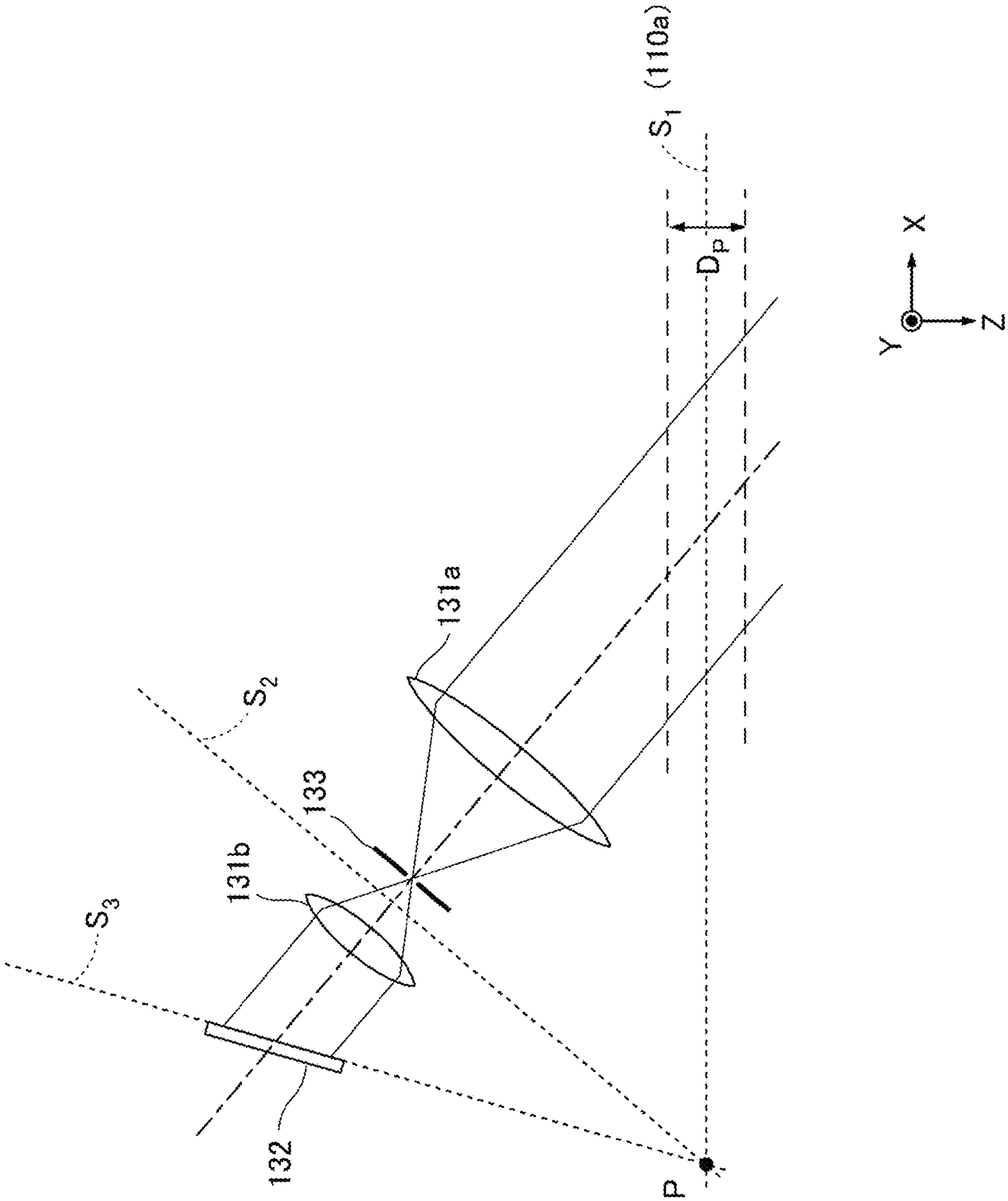
FIG. 3 is an explanatory diagram for illustrating the Scheimpflug optical system.

FIG. 3 is an explanatory diagram illustrating the Scheimpflug optical system employed in the first imaging unit 130. A similar Scheimpflug optical system is employed in the second imaging unit 140, but the Scheimpflug optical system of the first imaging unit 130 will be described as a representative here.

In FIG. 3, a plane $S_1$ is the focal plane 110*a* parallel to the stage surface of the stage 190. A virtual plane $S_2$ is a plane that includes the principal plane of the first optical system 131 composed of an object-side lens group 131*a* and an image-side lens group 131*b*. A plane $S_3$ is a plane that includes the light receiving surface of the first imaging element 132. In this embodiment, the Scheimpflug optical system includes the first optical system 131 and the first imaging element 132 that are arranged to satisfy the Scheimpflug condition. An arrangement that satisfies the Scheimpflug condition refers to an arrangement in which the plane $S_1$, the virtual plane $S_2$, and the virtual plane $S_3$ intersect one another on a common straight line P.

A diaphragm 133 is arranged between the object-side lens group 131*a* and the image-side lens group 131*b* to restrict the light flux passing therethrough. The depth of field $D_P$ can be adjusted by the diameter of the diaphragm 133. Accordingly, if the planned placement surface 330*a* of the lead frame 330 is positioned within this depth of field, the first imaging unit 130 can image the die pad and the pad reference mark, which will be described later, in a focused state. In this sense, the positional control for matching the focal plane 110*a* with the planned placement surface 330*a* allows a deviation within the range of the depth of field $D_P$.

The second imaging unit 140 has a configuration similar to that of the first imaging unit 130, and the second imaging unit 140 and the first imaging unit 130 are arranged on the head portion 110 symmetrically with respect to the YZ plane that includes the central axis of the bonding tool 120. Accordingly, like the first imaging unit 130, the second imaging unit 140 can also image the die pad and the pad reference mark in a focused state. The focal plane of the first imaging unit 130 and the focal plane of the second imaging unit 140 preferably coincide at the focal plane 110*a*, but even if a deviation occurs, the die pad and the pad reference mark can be imaged in a focused state as long as the depth of field partially overlaps.

Now, when the imaging unit employing such a Scheimpflug optical system is used, it is possible to observe directly below the bonding tool 120 from an oblique direction. Thus, the die pad can be observed with the top-view imaging units even in a state where the semiconductor chip 310 is held by the bonding tool 120 and the bonding tool 120 is moved directly above the die pad which is a planned placement area for the semiconductor chip 310. That is, after moving the bonding tool 120 directly above the die pad which is the planned placement area, the target position for placing the semiconductor chip 310 can be determined based on the top-view images output by the top-view imaging units. Then, since the semiconductor chip 310 may be moved to the target position from that state, the movement of the head portion 110 and the bonding tool 120 can be greatly suppressed, which makes it possible to reduce a positional deviation due to the movement and shorten the lead time.

However, it has been found that, in an imaging unit that employs a Scheimpflug optical system, due to structural characteristics of the optical system, the output image may be displaced in the plane direction even when the optical system and the imaging element are slightly displaced due to a temperature change in the surrounding environment. That is, it has been found that the image may shift depending on the temperature of the surrounding environment. Such a phenomenon causes an error in the target position when the target position for placing the semiconductor chip 310 is determined based on the top-view image, and results in impeding accurate bonding of the semiconductor chip to the original target position. In particular, when the bonding tool 120 is provided with the heater 124 for heating the semiconductor chip 310, the temperature change around the Scheimpflug optical system increases.

Therefore, in this embodiment, a calibration process is executed at a predetermined timing when a temperature change in the surrounding environment is expected, and the calibration values are calculated for calibrating the difference between the coordinate values calculated based on the top-view image and the coordinate values calculated based on the bottom-view image for the same observation target. Then, in a bonding process of bonding the semiconductor chip 310 to the target position on the lead frame 330, the accurate target position is determined by using the calibration values calculated by the calibration process. The calibration process and the bonding process will be described in order hereinafter.

Figure 4:
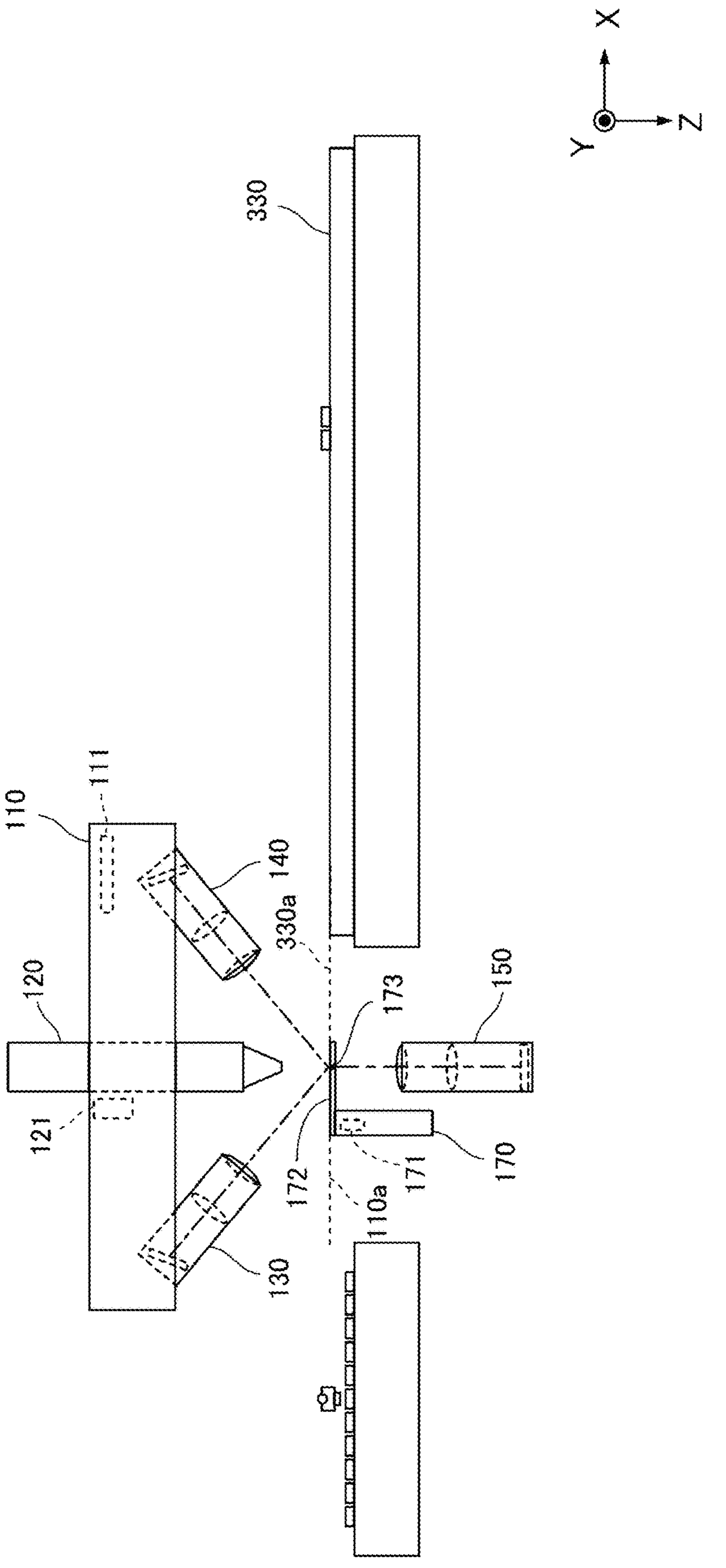
FIG. 4 is a diagram showing how three imaging units image the calibration index.

The calibration controller 213 is responsible for executing the calibration process. The calibration controller 213 first causes the first imaging unit 130, the second imaging unit 140, and the third imaging unit 150 to image the calibration index 173. FIG. 4 is a diagram showing how the three imaging units image the calibration index 173.

As shown in the drawing, the calibration controller 213 drives the index drive motor 171 via the drive controller 212 to move the index plate 172 into the field of view of the third imaging unit 150 when starting the calibration process. When the index plate 172 is moved into the field of view of the third imaging unit 150, the calibration index 173 provided on the index plate 172 is positioned substantially centrally with respect to the field of view of the fixed third imaging unit 150.

The calibration controller 213 subsequently drives the head drive motor 111 via the drive controller 212 to move the head portion 110 so that the focal plane 110*a* of the top-view imaging unit coincides with the planned placement surface 330*a* of the lead frame 330 and so that the calibration index 173 is positioned directly below the bonding tool 120. The bonding tool 120 is retracted to a position where the bonding tool 120 does not enter the field of view of the top-view imaging unit.

With each thus arranged, the calibration controller 213 acquires the first top-view image from the first imaging unit 130, the second top-view image from the second imaging unit 140, and the bottom-view image from the third imaging unit 150 via the image acquisition part 211. Then, the three-dimensional coordinates ($X_{hr}$, $Y_{hr}$, $Z_{hr}$) of the calibration index 173 are calculated from the image coordinates of the images of the calibration index 173 respectively reflected in the first top-view image and the second top-view image. Further, the three-dimensional coordinates ($X_{sr}$, $Y_{sr}$, $Z_{sr}$) of the calibration index 173 are calculated from the image coordinates of the image of the calibration index 173 reflected in the bottom-view image. If the top-view imaging units are not affected by the temperature change in the surrounding environment and maintain the state where the coordinates between the imaging units are correctly adjusted in the initial state of the bonding apparatus 100, it should be at least $X_{hr}=X_{sr}$ and $Y_{hr}$ $Y_{sr}$.

However, as described above, after the use of the bonding apparatus 100 is started for a while, the three-dimensional coordinates calculated from the top-view images include an error due to the influence of the temperature change in the surrounding environment. Thus, the error ($\Delta X$, $\Delta Y$) is used as the calibration values. Specifically, the error is expressed as a difference and can be set as $\Delta X=X_{sr}-X_{hr}$ and $\Delta Y$ $Y_{sr}-Y_{hr}$. If the calibration values are calculated in advance in this way, supposing that the top-view imaging unit images an observation target afterward and the three-dimensional coordinates calculated from the top-view image thereof are ($X_{ht}$, $Y_{ht}$, $Z_{ht}$), the three-dimensional coordinates can be corrected as ($X_{ht}+\Delta X$, $Y_{ht}+\Delta Y$, $Z_{ht}$) by adding the calibration values. It can be said that, assuming that the same observation target could be imaged by the bottom-view imaging unit, the corrected coordinate values have no error with respect to the coordinate values calculated from the bottom-view image obtained in that case.

The calibration controller 213 stores the calibration values calculated in this way in the storage part 220 as the calibration data 221. The calibration data 221 is referred to in the bonding process, which will be described later, until it is evaluated that the temperature of the surrounding environment may have changed and the calibration process needs to be performed again. In other words, when it is evaluated that the calibration process needs to be performed again, the calibration controller 213 repeats the above process to update the calibration values.

A timing at which the bonding controller 214 completes the bonding of semiconductor chips 310 for a preset lot can be considered as an example where it is evaluated that the calibration process needs to be performed again. Specifically, the calibration controller 213 may execute the calibration process in accordance with the timing at which a new lot of semiconductor chips 310 is supplied to the chip supply apparatus 500. In addition, the working time of the bonding work executed by the bonding controller 214 may be used as a guideline. For example, it can be determined that the calibration process is performed when the bonding work is performed continuously for 60 minutes. Furthermore, a temperature detector for detecting the temperature of the top-view imaging unit may be provided in the head portion 110, and the timing may be a timing at which the temperature detector detects a preset temperature. Specifically, a plurality of temperatures are set in advance, and the calibration process is executed when it is detected that the ambient temperature fluctuates across the temperatures. If the calibration values are updated in this way, it is possible to suppress an error of the coordinate values calculated from the top-view image within a certain range over a period in which the bonding process is continued.

Figure 5:
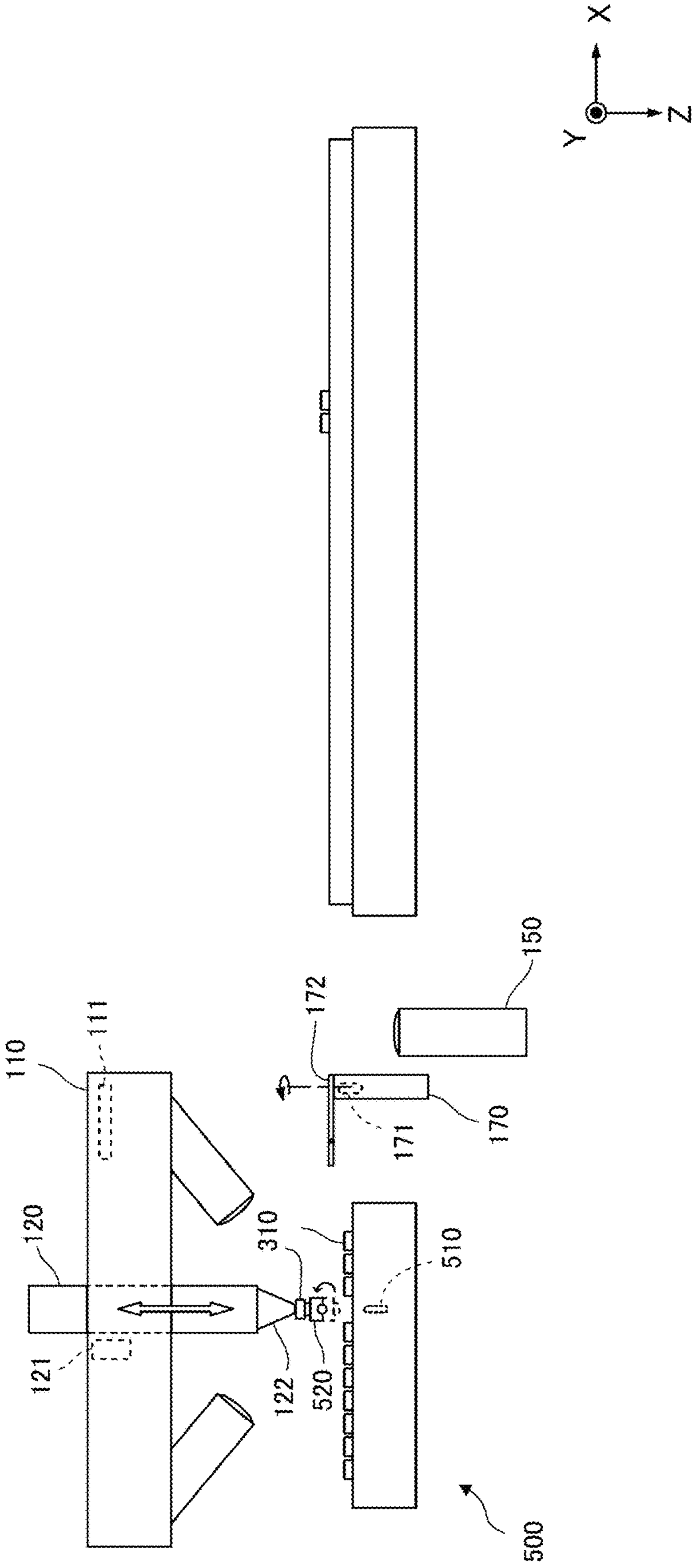
FIG. 5 is a diagram showing how the bonding tool picks up the semiconductor chip.

The bonding controller 214 is responsible for executing the bonding process. The bonding controller 214 first picks up the target semiconductor chip 310. FIG. 5 is a diagram showing how the bonding tool 120 picks up the semiconductor chip 310.

The bonding controller 214 drives the head drive motor 111 via the drive controller 212 to move the head portion 110 above the chip supply apparatus 500, and drives the tool drive motor 121 to lower the bonding tool 120. In parallel with this, the pickup mechanism 510 pushes up the target semiconductor chip 310 to be bonded among the semiconductor chips 310 placed on the chip supply apparatus 500 toward the reversing mechanism 520, and the reversing mechanism 520 sucks and reverses the semiconductor chip 310. Then, the lowered bonding tool 120 sucks and picks up the semiconductor chip 310 with the collet 122 and lifts the bonding tool 120.

When the index plate 172 is positioned within the field of view of the third imaging unit 150, the bonding controller 214 retracts the index plate 172 from the field of view of the third imaging unit 150 before and after the work of the bonding tool 120 picking up the semiconductor chip 310. Specifically, the bonding controller 214 drives the index drive motor 171 via the drive controller 212 to move the index plate 172.

Figure 6:
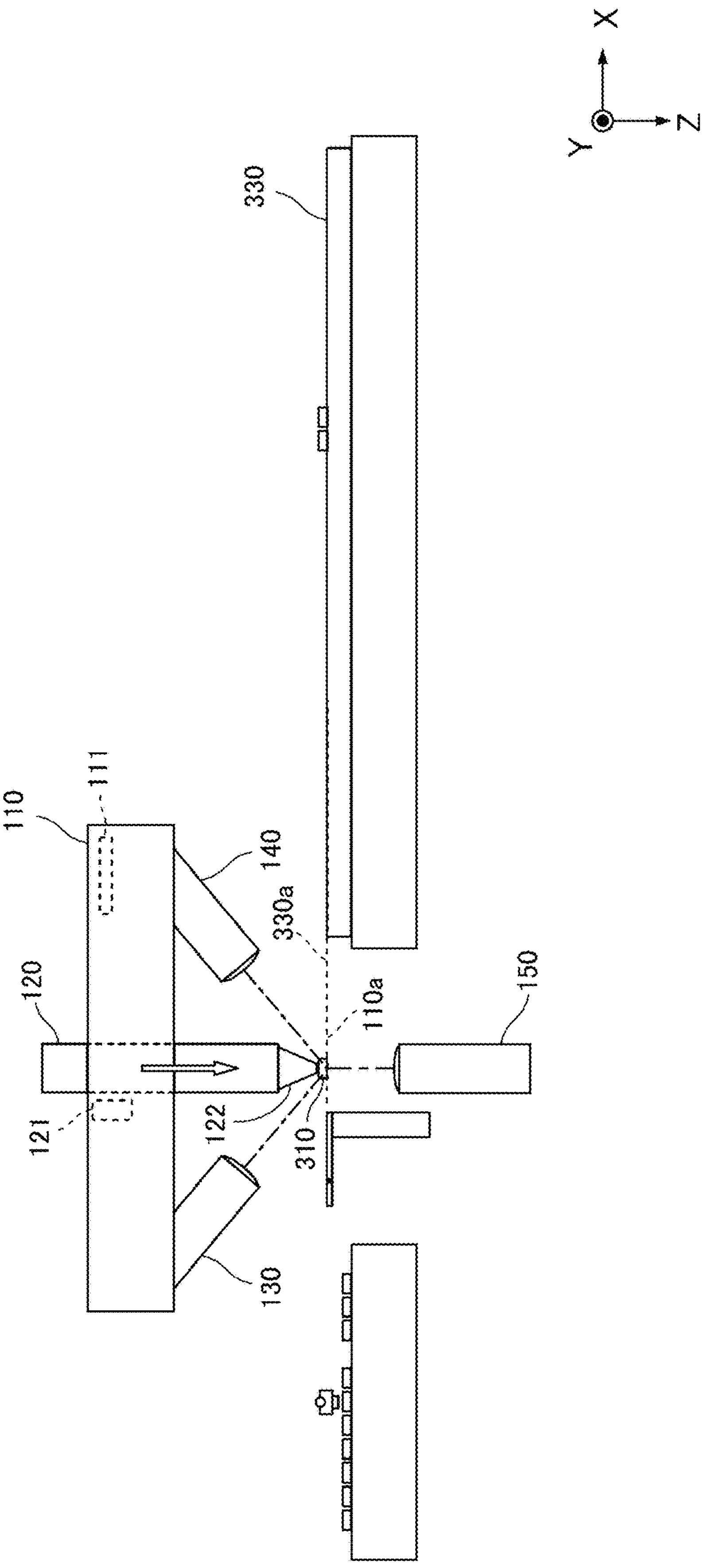
FIG. 6 is a diagram showing how the third imaging unit images the semiconductor chip.

Next, the bonding controller 214 causes the third imaging unit 150 to image the semiconductor chip 310 sucked by the bonding tool 120. FIG. 6 is a diagram showing how the third imaging unit 150 images the semiconductor chip 310 sucked by the bonding tool 120.

The bonding controller 214 drives the head drive motor 111 via the drive controller 212 to move the head portion 110 so that the focal plane 110*a* of the top-view imaging units coincides with the planned placement surface 330*a* of the lead frame 330 and so that the third imaging unit 150 is positioned directly below the bonding tool 120. Then, by driving the tool drive motor 121, the bonding tool 120 is lowered so that a planned contact surface of the held semiconductor chip 310 for contacting the lead frame 330 coincides with the planned placement surface 330*a* of the lead frame 330. When such arrangement adjustment is completed, the bonding controller 214 causes the third imaging unit 150 to image the semiconductor chip 310 held by the bonding tool 120 via the image acquisition part 211.

Figure 7:
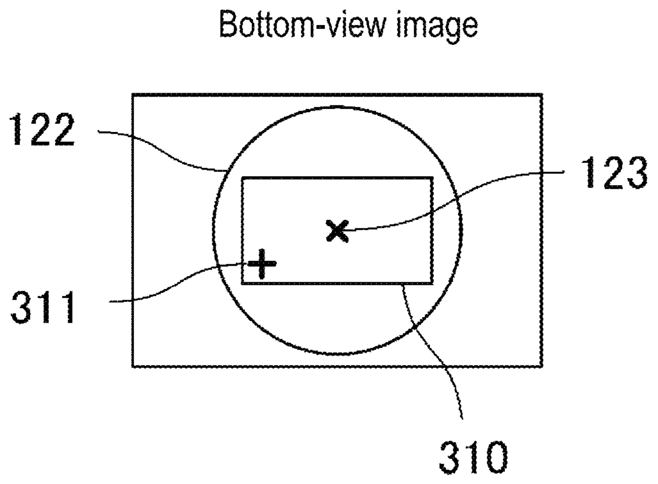
FIG. 7 is a diagram schematically showing the bottom-view image output by the third imaging unit.

FIG. 7 is a diagram schematically showing the bottom-view image output by the third imaging unit 150 by imaging the semiconductor chip 310 held by the bonding tool 120. Each subject image in the drawing will be described with the corresponding reference number of the subject as it is.

As described above, the bonding tool 120 is picked up and held by sucking the semiconductor chip 310 prepared by the chip supply apparatus 500 with the collet 122. At this time, the bonding tool 120 attempts to suck the center of the semiconductor chip 310 in a preset orientation, but in reality, the semiconductor chip 310 may be sucked with a deviation. Therefore, the bonding controller 214 confirms at what position and in what orientation the semiconductor chip 310 is actually held, and recognizes the reference position for placing the semiconductor chip 310 on the lead frame 330.

Since the bottom-view image shown in FIG. 7 is an image captured by the third imaging unit 150 looking up at the semiconductor chip 310, the collet 122 that holds the semiconductor chip 310 is also reflected. Thus, the bonding controller 214 calculates the image coordinates of a collet center 123 by detecting a circle that is the contour of the collet 122.

Further, the semiconductor chip 310 in this embodiment is provided with a chip reference mark 311 on the planned contact surface for contacting the lead frame 330, and the bonding controller 214 calculates the image coordinates of the chip reference mark 311 reflected in the bottom-view image. From the image coordinates of the collet center 123 and the image coordinates of the chip reference mark 311 thus calculated, the bonding controller 214 can recognize at what position and in what orientation the semiconductor chip 310 is actually held with respect to the collet 122. For example, if the position where the chip reference mark 311 is provided is the reference position for placing the semiconductor chip 310 on the lead frame 330, the bonding controller 214 can calculate the three-dimensional coordinates of the reference position of the semiconductor chip 310 at the time when the bottom-view image is captured. Thus, even if the bonding tool 120 and the head portion 110 are moved after that, the three-dimensional coordinates of the reference position can be tracked as long as the collet 122 continues to hold the semiconductor chip 310.

After recognizing the three-dimensional coordinates of the reference position, the bonding controller 214 drives the tool drive motor 121 to lift the bonding tool 120 to a position where the held semiconductor chip 310 is retracted from the field of view of the top-view imaging units. Then, by driving the head drive motor 111, the head portion 110 is moved so that the bonding tool 120 is directly above the die pad 320 on which the semiconductor chip 310 is to be placed and so that the focal plane 110*a* of the top-view imaging units coincides with the planned placement surface 330*a* of the lead frame 330. The lifting of the bonding tool 120 and the movement of the head portion 110 may be performed in parallel.

Figure 8:
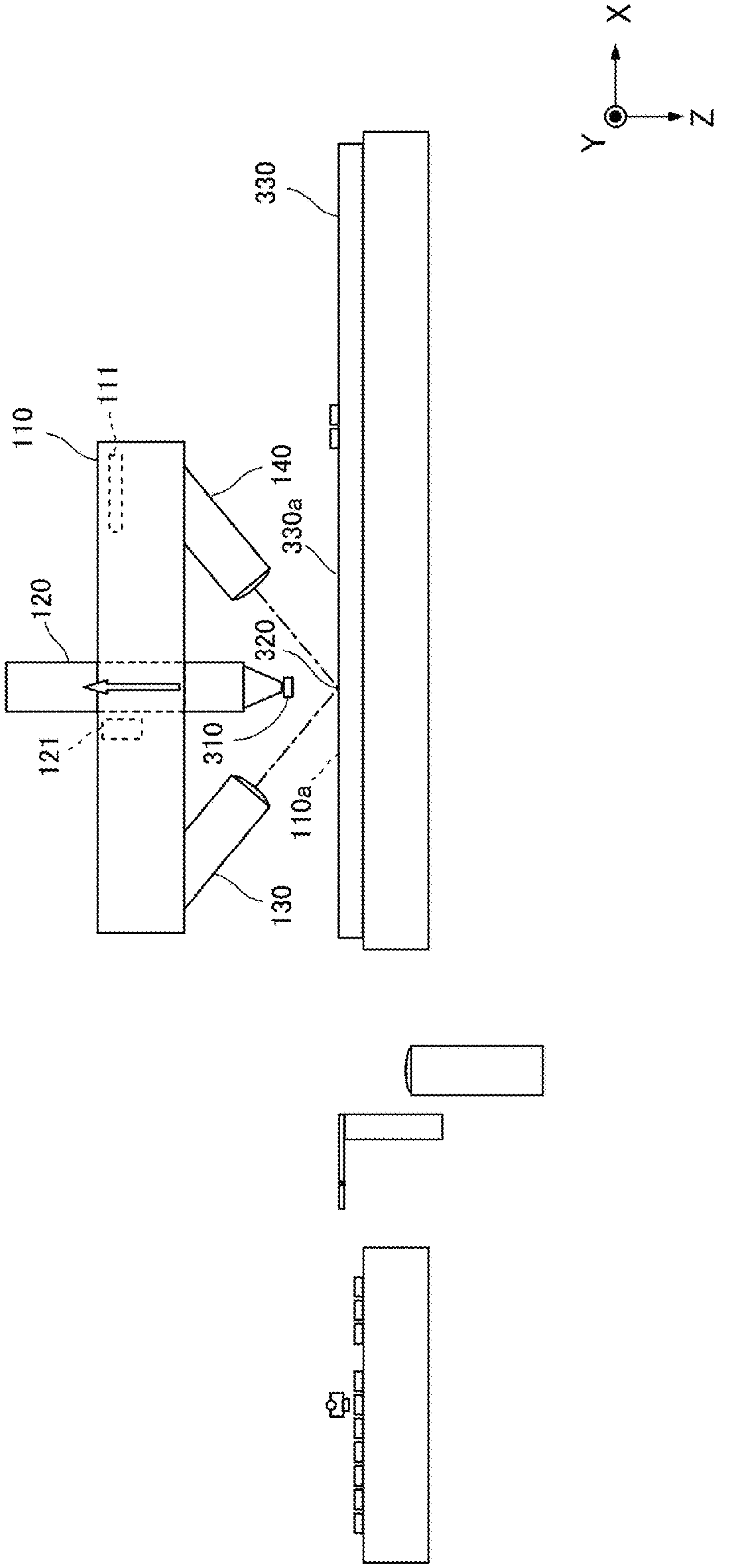
FIG. 8 is a diagram showing how the first imaging unit and the second imaging unit image the lead frame.
Figure 9:
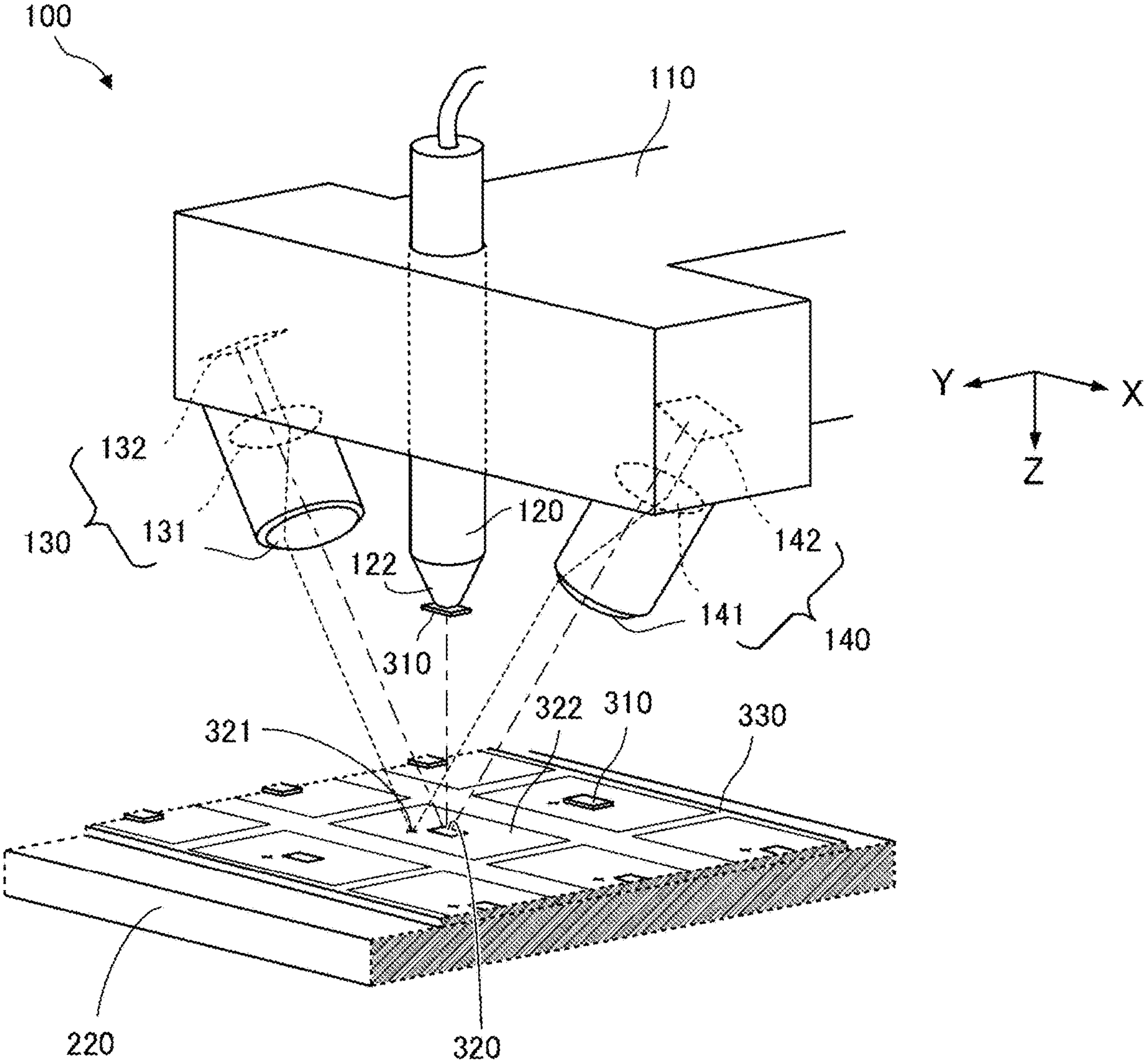
FIG. 9 is a partial perspective diagram of FIG. 8.

FIG. 8 is a diagram showing how the first imaging unit 130 and the second imaging unit 140 image the lead frame 330 with the head portion 110 and the bonding tool 120 arranged as described above. Further, FIG. 9 is a partial perspective diagram of FIG. 8. The lead frame 330 in this embodiment has one die pad 320 in each unit area 322 that will be cut out in the future to be housed in one package. In addition, each unit area 322 is provided with a pad reference mark 321 indicating the reference position thereof.

In the state of the arrangement as shown in FIG. 8 and FIG. 9, the first imaging unit 130 and the second imaging unit 140 can respectively catch the die pad 320 and the pad reference mark 321 included in the same unit area 322 within the field of view and image them in a focused state. The bonding controller 214 uses the first top-view image output by the first imaging unit 130 and the second top-view image output by the second imaging unit 140 to calculate the coordinates of the target position with which the reference position should coincide when placing the semiconductor chip 310 on the die pad 320.

Figure 10:
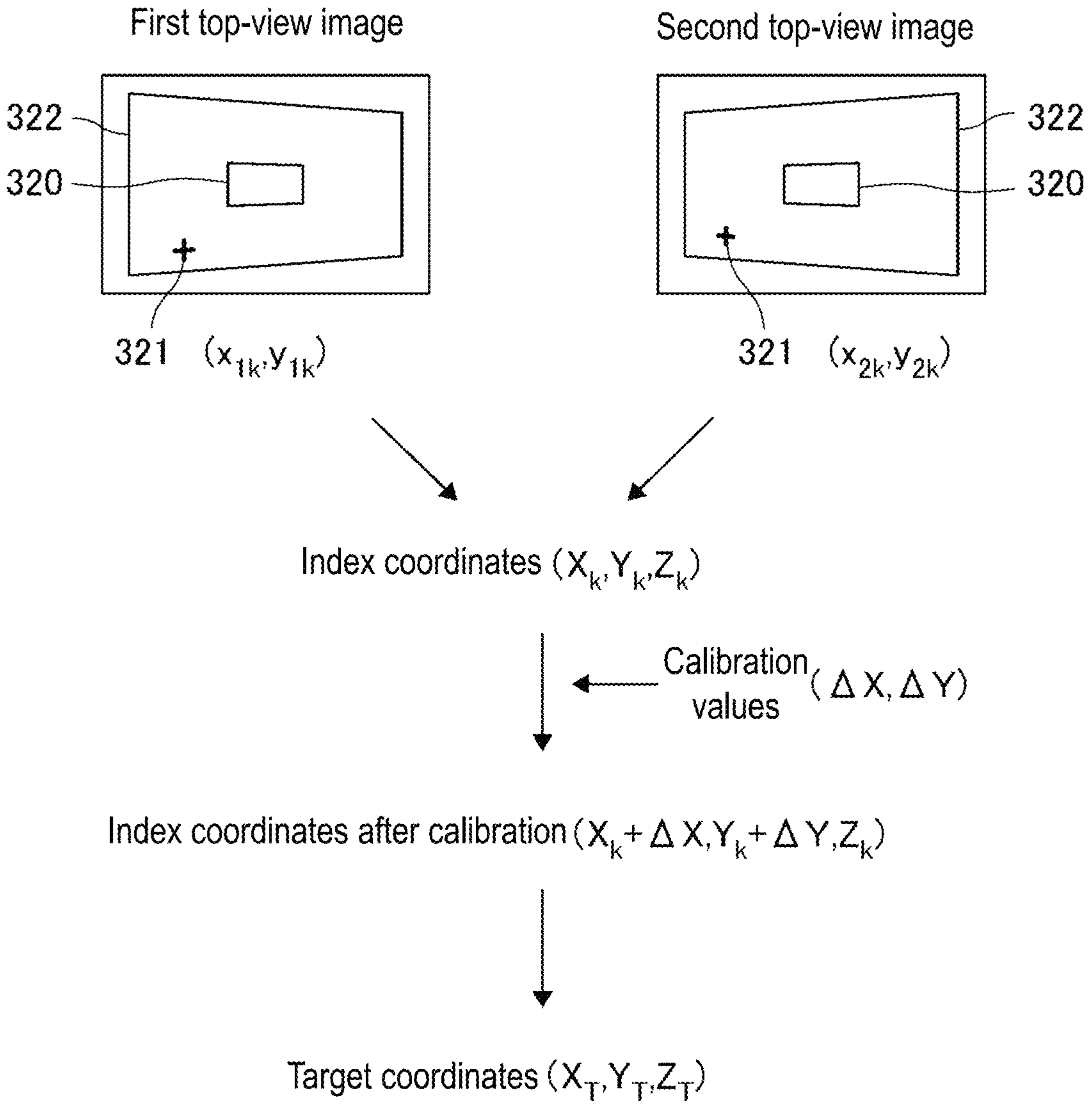
FIG. 10 is a diagram showing the procedure for calculating the target coordinates for placing the semiconductor chip from the first top-view image and the second top-view image.

FIG. 10 is a diagram showing the procedure for calculating the target coordinates for placing the semiconductor chip 310 from the first top-view image and the second top-view image. Since the first imaging unit 130 images the die pad 320 and the pad reference mark 321 from the side of the pad reference mark 321 with respect to the die pad 320, in the first top-view image which is the output image thereof, the unit area 322 is reflected in a trapezoidal shape expanding toward the side of the pad reference mark 321. Conversely, the second imaging unit 140 images the die pad 320 and the pad reference mark 321 from the opposite side of the pad reference mark 321 with respect to the die pad 320, in the second top-view image which is the output image thereof, the unit area 322 is reflected in a trapezoidal shape narrowing toward the side of the pad reference mark 321.

The bonding controller 214 determines the image coordinates $(x_{1k}, y_{1k})$ of the pad reference mark 321 from the first top-view image, and also determines the image coordinates $(x_{2k}, y_{2k})$ of the pad reference mark 321 from the second top-view image. Then, for example, by referring to a conversion table for converting image coordinates into three-dimensional coordinates, index coordinates $(X_k, Y_k, Z_k)$ which are three-dimensional coordinates of the pad reference mark 321 are calculated from these image coordinates. The coordinate values of the index coordinates are a provisional target position for calculating an accurate target position, and as described above, include an error due to the influence of the temperature change in the surrounding environment. Thus, the calibration values $(\Delta X, \Delta Y)$ are read out from the calibration data 221 and corrected. The corrected index coordinates $(X_k+\Delta X, Y_k+\Delta Y, Z_k)$ obtained in this way can be expected to have no error with respect to the spatial coordinates calculated from the bottom-view image.

Since the preset target position of the die pad 320 and the relative position of the pad reference mark 321 are known, the bonding controller 214 can accurately calculate the coordinates $(X_T, Y_T, Z_T)$ of the target position from the corrected index coordinates $(X_k+\Delta X, Y_k+\Delta Y, Z_k)$.

Figure 11:
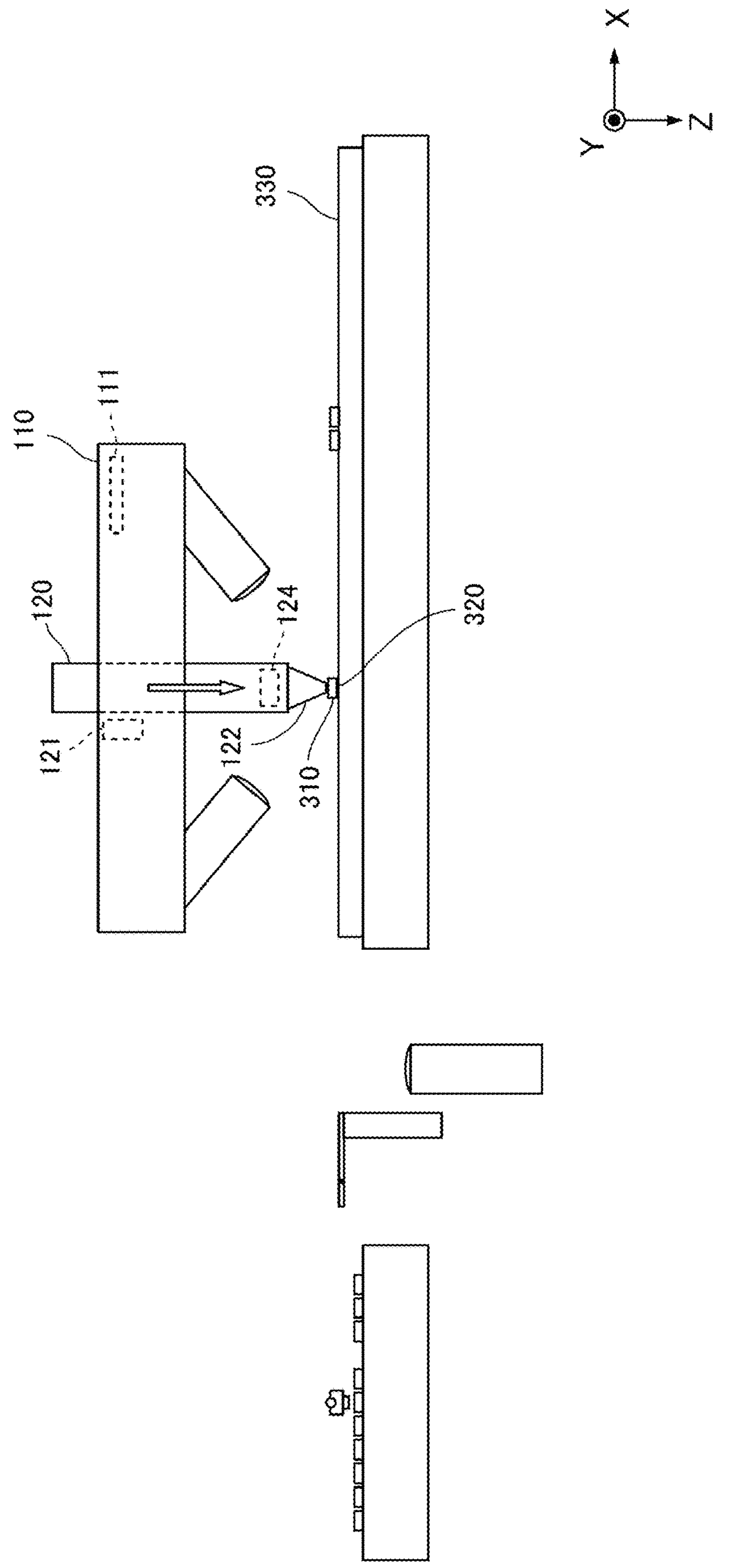
FIG. 11 is a diagram showing how the bonding tool places and bonds the semiconductor chip to the target position.

After determining the coordinates of the target position, the semiconductor chip 310 is placed at the target position and bonded. FIG. 11 is a diagram showing how the bonding tool 120 places and bonds the semiconductor chip 310 to the target position.

As described above, the bonding controller 214 tracks and grasps the three-dimensional coordinates of the reference position of the semiconductor chip 310 with respect to the movement of the bonding tool 120 and the head portion 110, and moves the semiconductor chip 310 so that this reference position coincides with the target position of the die pad 320. Specifically, the position of the head portion 110 in the XY directions is finely adjusted by driving the head drive motor 111 via the drive controller 212, and the amount of rotation of the bonding tool 120 around the Z-axis is finely adjusted by driving the tool drive motor 121. Then, the bonding tool 120 is lowered with the X coordinate and the Y coordinate of the reference position respectively coinciding with the X coordinate and the Y coordinate of the target position, to place the semiconductor chip 310 on the die pad 320. Thereafter, the semiconductor chip 310 is heated by the heater 124 while being pressed by the tip portion of the collet 122 to be bonded to the die pad 320.

In this embodiment, as illustrated with reference to FIG. 4, the calibration values are calculated by aligning the focal plane 110*a* of the top-view imaging units and the printed surface of the calibration index 173 with the planned placement surface 330*a* of the lead frame 330. That is, the position of the head portion 110 in the Z direction when the calibration values are calculated is the same as the position of the head portion 110 in the Z direction when the top-view imaging units image the chip reference mark 311. Further, as illustrated with reference to FIG. 6 and FIG. 7, the three-dimensional coordinates of the chip reference mark 311 are calculated by aligning the planned contact surface of the semiconductor chip 310 held by the collet 122 with the planned placement surface 330*a* of the lead frame 330. That is, the position of the bonding tool 120 in the Z direction when the three-dimensional coordinates of the chip reference mark 311 are calculated is the same as the position of the bonding tool 120 in the Z direction when the semiconductor chip 310 is placed on the die pad 320.

Thus, there is no need to consider an error between the actual three-dimensional coordinates and the recognized three-dimensional coordinates in the XY directions, which may occur when the head portion 110 and the bonding tool 120 are moved in the Z direction. For example, in the state of FIG. 8, the bonding tool 120 holds the semiconductor chip 310 and retracts from the field of view of the top-view imaging units, but the X coordinate and the Y coordinate of the actual reference position in this state may not coincide with the X coordinate and the Y coordinate recognized by the bonding controller 214 due to the influence of play between elements of the moving mechanism that moves the bonding tool 120 up and down. However, the height of the bonding tool 120 when the semiconductor chip 310 is placed on the planned placement surface 330*a* as shown in FIG. 11 is the same as the height of the bonding tool 120 when the three-dimensional coordinates of the chip reference mark 311 are calculated, and error factors due to the moving mechanism are eliminated. In other words, the X coordinate and the Y coordinate of the actual reference position when the semiconductor chip 310 is placed on the planned placement surface 330*a* coincide with the X coordinate and the Y coordinate recognized by the bonding controller 214. From this point of view, it is effective to match the focal plane 110*a* and the printed surface of the calibration index 173 with the planned placement surface 330*a* when calculating the calibration values, and match the planned contact surface of the semiconductor chip 310 with the planned placement surface 330*a* when calculating the three-dimensional coordinates of the chip reference mark 311.

Figure 12:
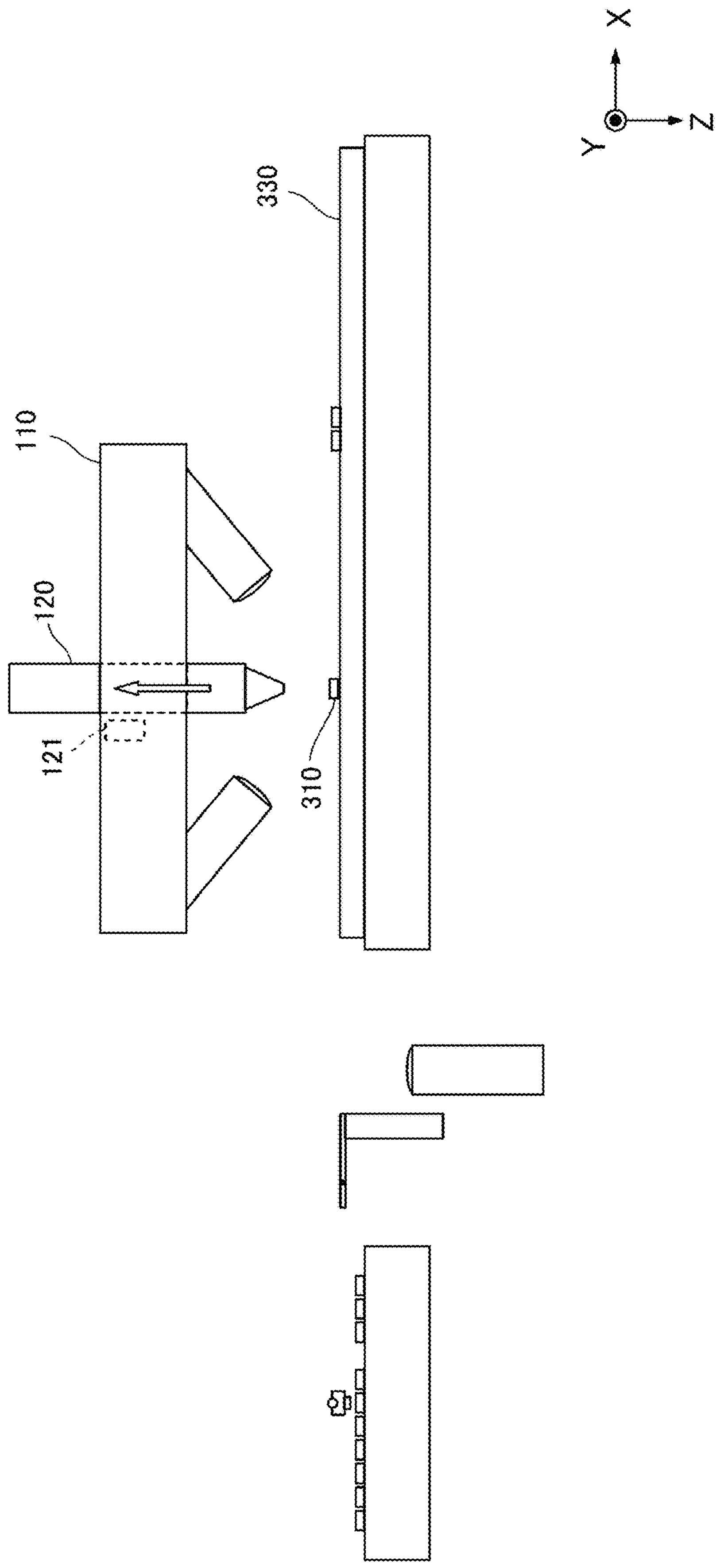
FIG. 12 is a diagram showing how the bonding tool is retracted.

FIG. 12 is a diagram showing how the bonding tool 120 is retracted. After the bonding of the semiconductor chip 310 is completed as shown in the drawing, the bonding controller 214 drives the tool drive motor 121 via the drive controller 212 to lift the bonding tool 120. When bonding a new semiconductor chip 310, the bonding controller 214 returns to the state of FIG. 5 and repeats the process again.

Figure 13:
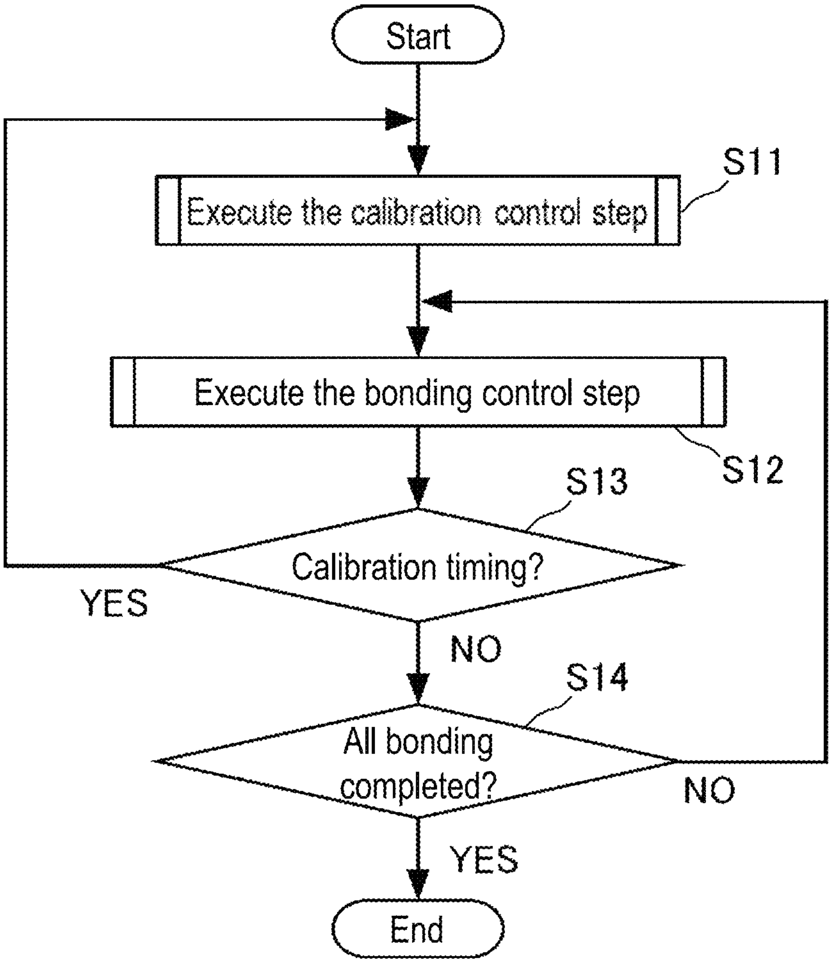
FIG. 13 is a flowchart illustrating the bonding procedure of the semiconductor chip.

Next, the entire bonding procedure, including the calibration process and the bonding process described above, will be summarized in accordance with flowcharts. FIG. 13 is a flowchart illustrating the bonding procedure of the semiconductor chip 310.

The calibration controller 213 starts a calibration control step to perform the calibration process in step S11. Details will be described later as a sub-flow. The first calibration control step may be skipped when the bonding process is started from the initial state in which the coordinates between the imaging units are correctly adjusted.

After the calibration controller 213 finishes the execution of the calibration control step, the procedure proceeds to step S12, and the bonding controller 214 starts a bonding control step to perform the bonding process. Details will be described later as a sub-flow.

After the bonding controller 214 finishes the execution of the bonding control step, the procedure proceeds to step S13, and the calibration controller 213 determines whether the state of the bonding apparatus 100 at that time satisfies a preset calibration timing condition. The preset calibration timing condition is a set condition that may require the calibration process to be performed again. For example, as described above, the number of processed lots, the working time of the bonding work, the temperature detected by the temperature detector, etc. are candidates for the set condition.

If the calibration controller 213 determines in step S13 that the condition is satisfied, the procedure returns to step S11. If it is determined that the condition is not satisfied, the procedure proceeds to step S14. When proceeding to step S14, the bonding controller 214 determines whether all scheduled bonding processes are completed. If it is determined that there remain semiconductor chips 310 to be bonded, the procedure returns to step S12, and if it is determined that all the bonding processes are completed, the series of processes ends.

Figure 14:
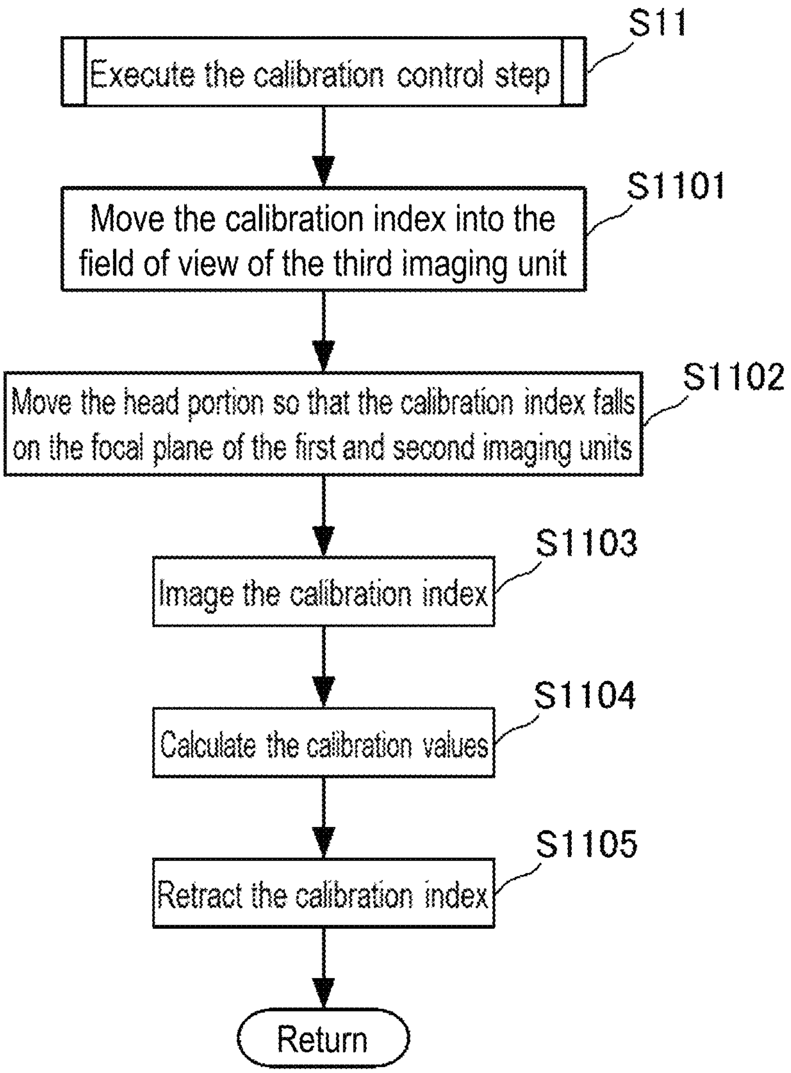
FIG. 14 is a sub-flowchart illustrating the procedure of the calibration control step.

FIG. 14 is a sub-flowchart illustrating the procedure of the calibration control step. In the calibration control step, mainly the process illustrated with reference to FIG. 4 is executed. The calibration controller 213 moves the index plate 172 to put the calibration index 173 into the center of the field of view of the third imaging unit 150 in step S1101. Subsequently, in step S1102, the calibration controller 213 moves the head portion 110 so that the calibration index 173 falls on the focal plane 110*a* of the first imaging unit 130 and the second imaging unit 140 and so that the calibration index 173 is positioned directly below the bonding tool 120. The printed surface of the calibration index 173 is adjusted so as to coincide with the planned placement surface 330*a* of the lead frame 330 as described above.

The calibration controller 213 proceeds to step S1103, and causes each imaging unit to image via the image acquisition part 211 and acquires the first top-view image from the first imaging unit 130, the second top-view image from the second imaging unit 140, and the bottom-view image from the third imaging unit 150. Then, in subsequent step S1104, the three-dimensional coordinates of the calibration index 173 are calculated based on the image coordinates of the images of the calibration index 173 respectively reflected in the first top-view image and the second top-view image, and the three-dimensional coordinates of the calibration index 173 are calculated based on the image of the calibration index 173 reflected in the bottom-view image. The calibration controller 213 calculates, as the calibration values, the difference in the XY plane direction among the three-dimensional coordinates thus calculated. The calculated calibration values are stored in the storage part 220 as the calibration data 221.

Thereafter, the calibration controller 213 moves the index plate 172 to retract the calibration index 173 from the field of view of the third imaging unit 150 in step S1105. After the calibration index 173 is retracted, the procedure returns to the main flow. The calibration index 173 may be retracted during the subsequent bonding process.

Figure 15:
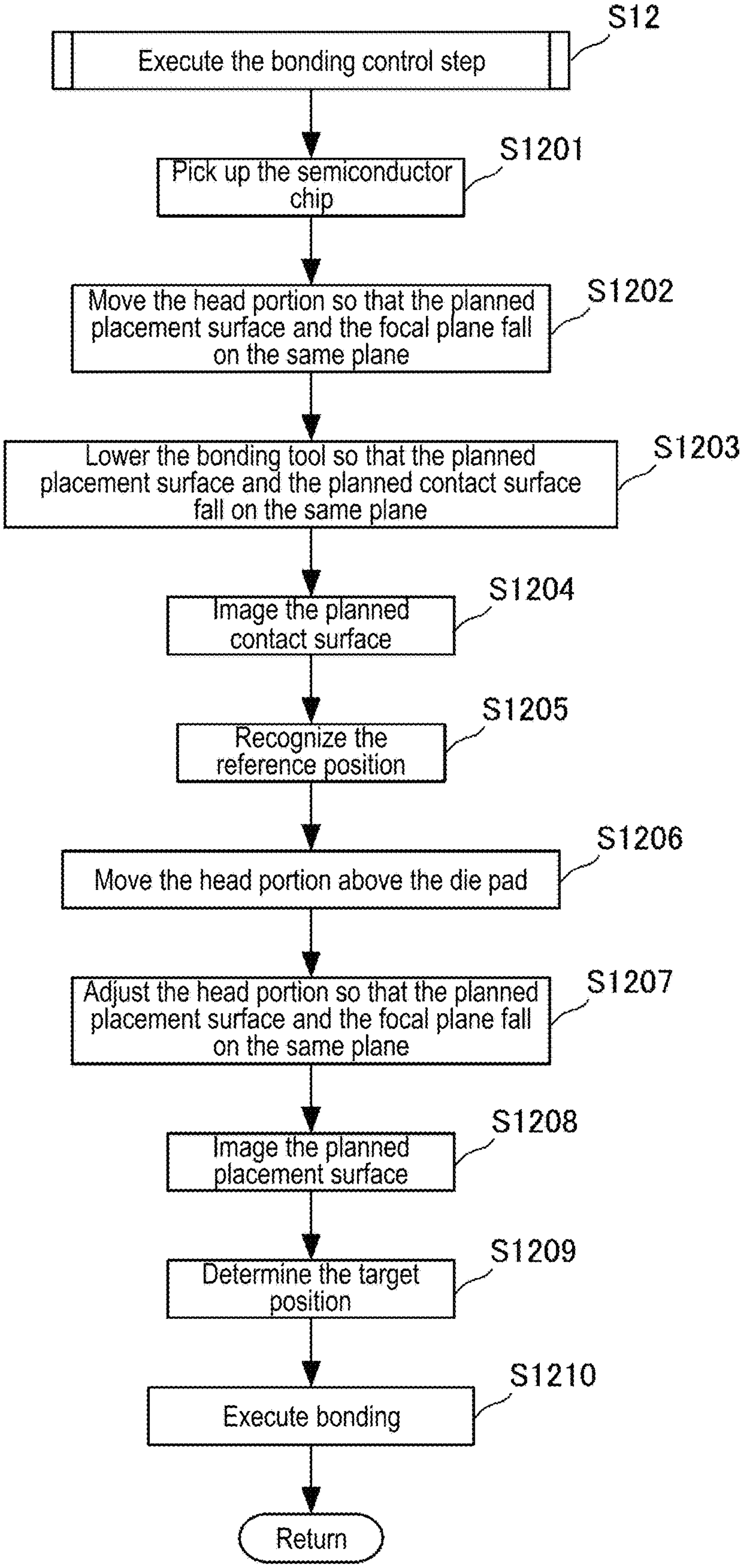
FIG. 15 is a sub-flowchart illustrating the procedure of the bonding control step.

FIG. 15 is a sub-flowchart illustrating the procedure of the bonding control step. In the bonding control step, mainly the process illustrated with reference to FIG. 5 to FIG. 12 is executed.

In step S1201, the bonding controller 214 moves the head portion 110 above the chip supply apparatus 500 and lowers the bonding tool 120. Then, the semiconductor chip 310 to be bonded, among the semiconductor chips 310 placed on the chip supply apparatus 500, is reversed by the pickup mechanism 510 and the reversing mechanism 520, and sucked and picked up by the collet 122, and the bonding tool 120 is lifted.

In step S1202, the bonding controller 214 moves the head portion 110 so that the focal plane 110*a* of the top-view imaging units coincides with the planned placement surface 330*a* of the lead frame 330 and so that the third imaging unit 150 is positioned directly below the bonding tool 120. Furthermore, in step S1203, the bonding tool 120 is lowered so that the planned contact surface of the held semiconductor chip 310 for contacting the lead frame 330 coincides with the planned placement surface 330*a* of the lead frame 330.

When such arrangement adjustment is completed, in step S1204, the bonding controller 214 causes the third imaging unit 150 to image the planned contact surface of the semiconductor chip 310 held by the bonding tool 120. Then, in step S1205, the bottom-view image output by the third imaging unit 150 is acquired, and the three-dimensional coordinates of the reference position of the semiconductor chip 310 are recognized based on the image coordinates of the reflected chip reference mark 311.

In step S1206, the bonding controller 214 lifts the bonding tool 120 to a position where the held semiconductor chip 310 is retracted from the field of view of the top-view imaging units, and moves the head portion 110 so that the bonding tool 120 is directly above the die pad 320 on which the semiconductor chip 310 is to be placed. In subsequent step S1207, the height of the head portion 110 is adjusted so that the focal plane 110*a* of the top-view imaging units coincides with the planned placement surface 330*a* of the lead frame 330.

When such arrangement adjustment is completed, in step S1208, the bonding controller 214 causes the first imaging unit 130 and the second imaging unit 140 to image the unit area 322 including the die pad 320 and the pad reference mark 321 as the target on the planned placement surface. Then, in step S1209, the first top-view image output by the first imaging unit 130 and the second top-view image output by the second imaging unit 140 are acquired, and the three-dimensional coordinates of the target position are calculated based on the image coordinates of the reflected pad reference mark 321 and the calibration values.

After the target position is determined, the procedure proceeds to step S1210, and after the coordinates of the target position are determined, the head portion 110 and the bonding tool 120 are moved so that the reference position of the semiconductor chip 310 coincides with the target position, and the semiconductor chip 310 is placed on the die pad 320. Thereafter, the semiconductor chip 310 is pressurized/heated to complete the bonding. After the bonding is completed, the bonding tool 120 is lifted and the procedure returns to the main flow.

In the embodiment described above, the calibration process and the bonding process are separated, and the calibration process is performed when the state of the bonding apparatus 100 satisfies the preset calibration timing condition. Accordingly, once the calibration process is executed, the calculated calibration values are held in the storage part 220, and the calibration values are continuously referred to each time in the bonding process performed until the next calibration process is executed. However, the procedure may be set such that the calibration process is incorporated into a series of bonding processes, and the calibration values are updated each time the semiconductor chip 310 is bonded. Other such embodiments will be described below. In the following other embodiments, the configuration of the bonding apparatus itself is the same as that of the above-described embodiments, and thus the description thereof will be omitted and mainly the difference in the processing procedure will be described.

Figure 16:
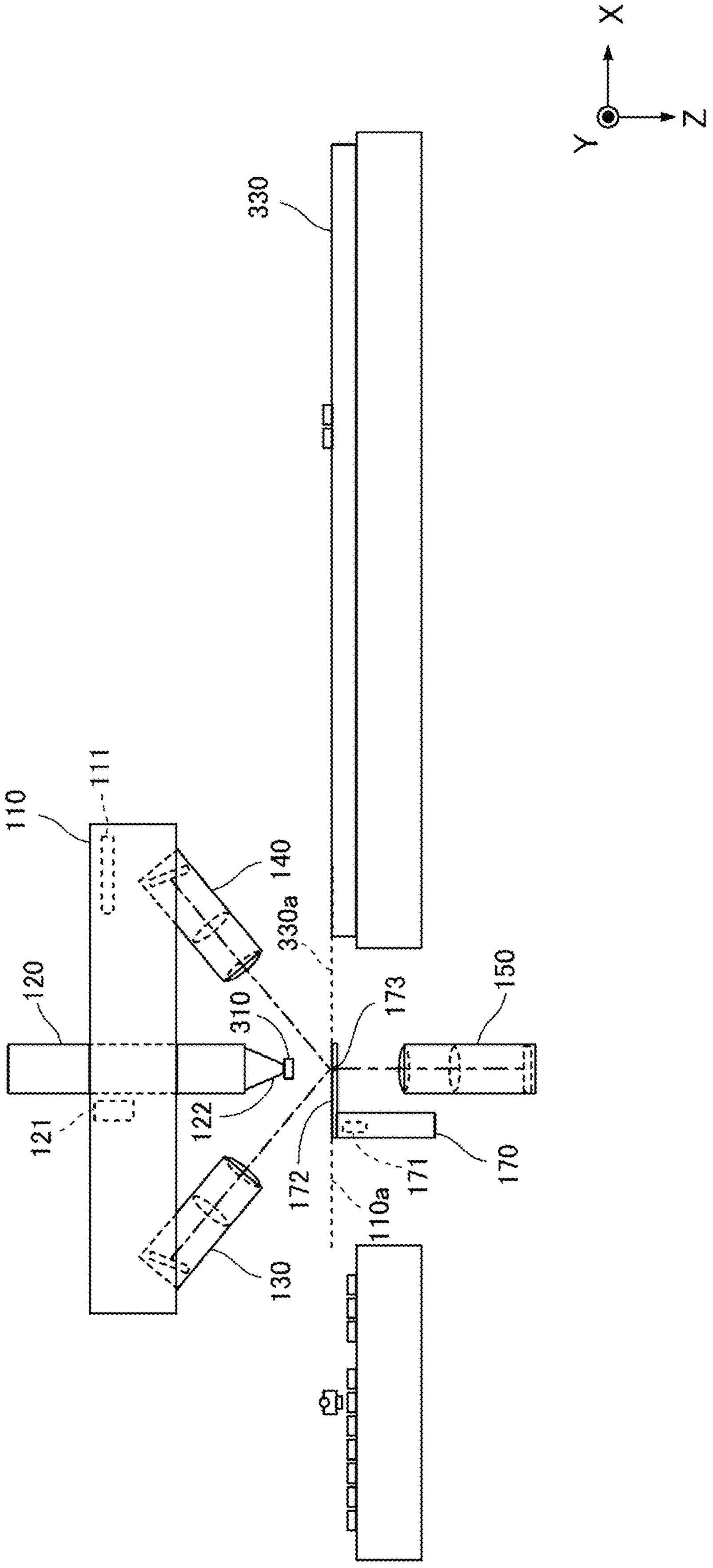
FIG. 16 is a diagram showing how three imaging units image the calibration index in another embodiment.

FIG. 16 is a diagram illustrating how three imaging units image the calibration index 173 in another embodiment. In this embodiment, the calibration process for calculating the calibration values is executed between the pickup process of the semiconductor chip 310 described with reference to FIG. 5 and the imaging process of the semiconductor chip 310 performed by the third imaging unit 150 described with reference to FIG. 6 in the above embodiments.

More specifically, FIG. 16 shows how the collet 122 retracts from the field of view of the top-view imaging units while holding the semiconductor chip 310 to be bonded. The other aspects are the same as those where the three imaging units shown in FIG. 4 image the calibration index 173. Specifically, the position of the head portion 110 is adjusted so that the focal plane 110*a* of the top-view imaging units coincides with the planned placement surface 330*a* of the lead frame 330 and the printed surface of the calibration index 173. In addition, the calibration index 173 is arranged near the center of the field of view of each imaging unit.

The calibration controller 213 calculates the calibration values as described above based on the first top-view image, the second top-view image, and the bottom-view image captured by the imaging units. After the calibration controller 213 calculates the calibration values, the bonding controller 214 subsequently lowers the bonding tool 120 and executes the process following the imaging of the semiconductor chip 310 performed by the third imaging unit 150 illustrated with reference to FIG. 6. These processing procedures may be reversed. Thus, the calibration values calculated in the calibration process executed in synchronization with the bonding process are used only for alignment of the semiconductor chip 310 to be bonded in the bonding process. Thus, if the calibration controller 213 causes each imaging unit to image the calibration index in synchronization with the process of the bonding controller 214 causing the third imaging unit 150 to image the semiconductor chip 310, and updates the calibration values in each bonding process, it is possible to shorten the time interval between the time when the calibration values are calculated and the time when the calibration values are used. Accordingly, it can be expected to achieve more accurate alignment with respect to the temperature change in the surrounding environment.

Figure 17:
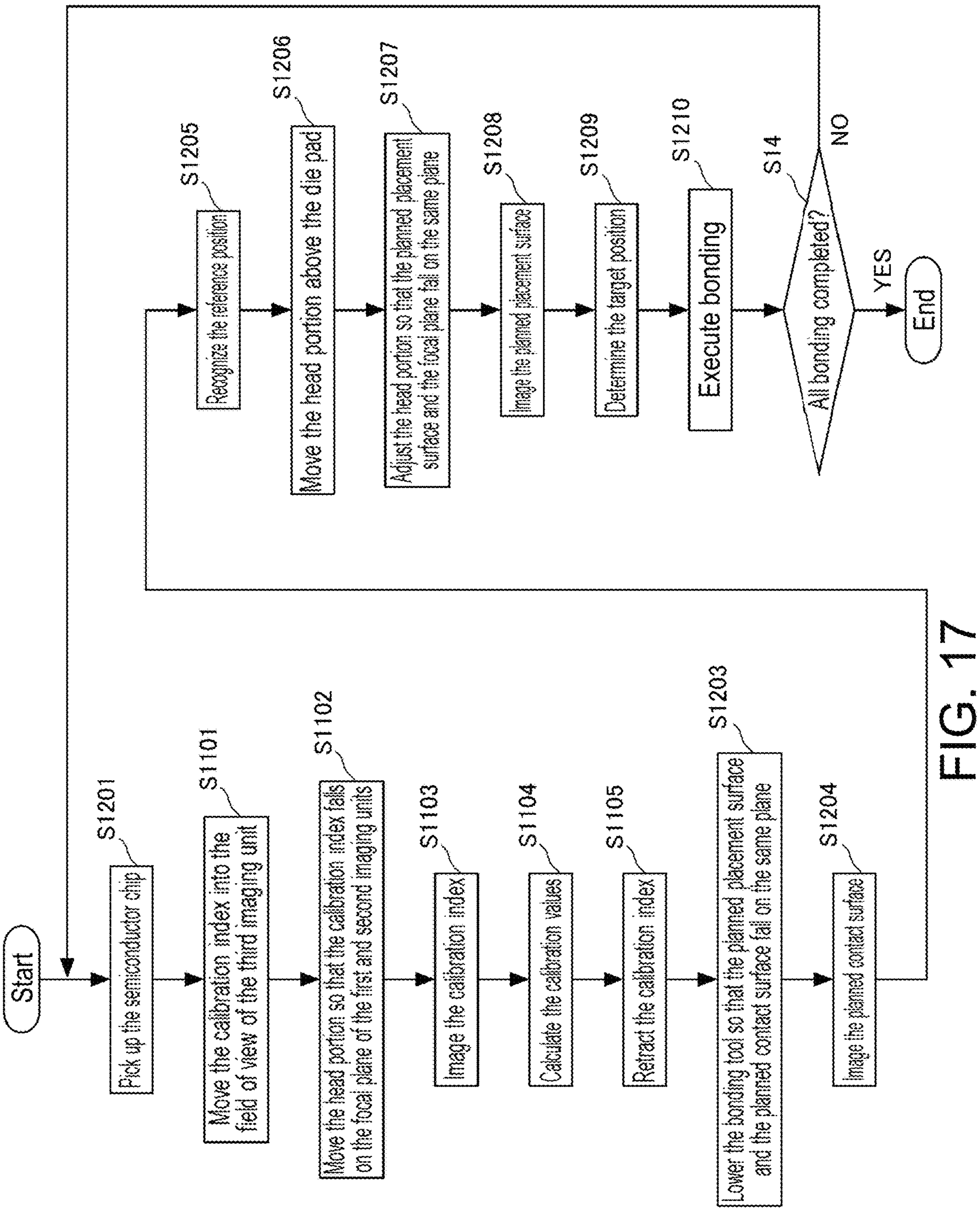
FIG. 17 is a flowchart illustrating the bonding procedure of the semiconductor chip in another embodiment.

FIG. 17 is a flowchart illustrating the bonding procedure of the semiconductor chip 310 in another embodiment. The same processing procedures as illustrated with reference to FIG. 13 to FIG. 15 are given the same step numbers, and the description of the processing contents thereof is omitted. As described above, this embodiment is a processing procedure that incorporates the calibration process into each bonding process, so the flow of the process will be mainly described.

When the semiconductor chip 310 to be bonded is determined, the bonding controller 214 sucks and picks up the semiconductor chip 310 in step S1201. Before or after step S1201 or in parallel with step S1201, the calibration controller 213 executes step S1101 to move the index plate 172 and put the calibration index 173 into the center of the field of view of the third imaging unit 150. Subsequently, the calibration controller 213 executes step S1102 to move the head portion 110 following step S1201. The control for moving the head portion 110 and the bonding tool 120 may be performed by the bonding controller 214 as a series of controls related to the bonding process.

In subsequent step S1103, the calibration controller 213 causes the first imaging unit 130, the second imaging unit 140, and the third imaging unit 150 to image, and further calculates the calibration values in step S1104. After calculating the calibration values, the procedure proceeds to step S1105 to retract the calibration index 173 from the field of view of each imaging unit.

After the calibration controller 213 retracts the calibration index 173, the bonding controller 214 executes step S1203 to lower the planned contact surface of the semiconductor chip 310 until the planned contact surface coincides with the planned placement surface 330*a*. Step S1203 to step S1210 are the same as the processing procedure illustrated with reference to FIG. 15. Nevertheless, the calibration values used in the calculation for determining the target position in step S1209 are the calibration values calculated in step S1104 executed prior to step S1203.

After completing the process of step S1210, the bonding controller 214 determines in step S14 whether all the scheduled bonding processes are completed. If it is determined that there remain semiconductor chips 310 to be bonded, the procedure returns to step S1201, and if it is determined that all the bonding processes are completed, the series of processes ends.

In the embodiment described above, in order to allow each imaging unit to image the calibration index 173 under better conditions, the calibration index 173 is moved near the center of the field of view of each imaging unit. Therefore, in the bonding process, it is necessary to retract the calibration index 173 from the field of view of each imaging unit. However, for example, if each imaging unit has an optical system with performance that does not have aberration in the peripheral portion of the field of view to cause an error in position calculation, the calibration index may be arranged in the peripheral portion of the field of view so as to be observed at all times. That is, if there is almost no influence on the calculation of the calibration values and the calibration index does not interfere when the third imaging unit 150 images the planned contact surface of the semiconductor chip 310 during the bonding process, the calibration index may be constantly arranged in the peripheral portion of the field of view of each imaging unit. With such a calibration index, the index drive motor 171 can be omitted from the calibration unit 170. Moreover, since the control for advancing and retracing the calibration index is not required, it contributes to shortening the lead time.

In addition, in the embodiment described above, the top-view imaging units include the first imaging unit 130 and the second imaging unit 140, but the top-view imaging units may include three or more imaging units each employing a Scheimpflug optical system. Further, in the embodiment described above, the three-dimensional coordinates of the object are calculated by using the parallax between the first top-view image and the second top-view image, but the method of calculating the three-dimensional coordinates using the top-view imaging units is not limited thereto. For example, other auxiliary means may be used with one top-view imaging unit that employs a Scheimpflug optical system. For example, the head portion 110 may be provided with a light projection part capable of pattern light projection, and the shape of the light projection pattern observed on an observation surface may be analyzed based on the top-view image output by the top-view imaging unit so as to calculate the three-dimensional coordinates of the object. In addition, although the embodiment illustrates a flip chip bonder, the present invention is not limited thereto and can be applied to a die bonder, a surface mounter for mounting electronic components on a substrate or the like, and other mounting apparatuses.

What is claimed is:

1. A mounting apparatus, comprising:

a mounting tool picking up and holding a mounting body, and placing and mounting the mounting body on a substrate placed on a stage;

top-view imaging units, in which respective optical systems and imaging elements are arranged to satisfy a Scheimpflug condition so that a plane parallel to a stage surface of the stage becomes a focal plane, for imaging from above the substrate from the same side as the mounting tool with respect to the stage surface;

a bottom-view imaging unit for imaging from below the mounting body that is in a state of being held by the mounting tool from a side opposite to the top-view imaging units with respect to the stage surface;

a calibration controller calculating calibration values for calibrating a difference between coordinate values calculated based on top-view images output by the top-view imaging units and coordinate values calculated based on a bottom-view image output by the bottom-view imaging unit, based on the top-view images output by the top-view imaging units by imaging a preset calibration index and the bottom-view image output by the bottom-view imaging unit by imaging the calibration index; and a mounting controller recognizing a reference position of the mounting body based on the bottom-view image output by the bottom-view imaging unit by imaging the mounting body held by the mounting tool, and causing the mounting tool to place and mount the mounting body on the substrate so that the reference position coincides with a target position determined based on the top-view images output by the top-view imaging units by imaging the substrate and the calibration values.

2. The mounting apparatus according to claim 1, wherein the calibration controller adjusts a position of a head portion that supports the top-view imaging units and the mounting tool so that the calibration index arranged on the same plane as a planned placement surface of the mounting body falls on the focal plane of the top-view imaging units.

3. The mounting apparatus according to claim 2, wherein the mounting controller adjusts the position of the head portion so that the focal plane of the top-view imaging units falls on the same plane as the planned placement surface, and adjusts a position of the mounting tool so that a planned contact surface of the mounting body held by the mounting tool for contacting the substrate falls on the same plane as the planned placement surface, when causing the bottom-view imaging unit to image the mounting body held by the mounting tool.

4. The mounting apparatus according to claim 1, wherein the calibration controller calculates and updates the calibration values each time the mounting controller completes mounting of the mounting bodies for a preset lot.

5. The mounting apparatus according to claim 1, wherein the calibration controller calculates and updates the calibration values based on a working time of a mounting work executed by the mounting controller.

6. The mounting apparatus according to claim 1, comprising a temperature detector that detects a temperature of the top-view imaging units, wherein the calibration controller calculates and updates the calibration values when the temperature detector detects a preset temperature.

7. The mounting apparatus according to claim 1, wherein the calibration controller respectively causes the top-view imaging units and the bottom-view imaging unit to image the calibration index in synchronization with a process that the mounting controller causes the bottom-view imaging unit to image the mounting body.

8. The mounting apparatus according to claim 1, wherein the top-view imaging units comprise a first imaging unit and a second imaging unit that are adjusted so that focal planes of the first imaging unit and the second imaging unit coincide, and the mounting controller corrects a provisional target position calculated based on a first top-view image output by the first imaging unit by imaging the substrate and a second top-view image output by the second imaging unit by imaging the substrate by the calibration values to be the target position.

9. A mounting method for a mounting body using a mounting apparatus, which comprises a mounting tool picking up and holding the mounting body and placing and mounting the mounting body on a substrate placed on a stage; top-view imaging units in which respective optical systems and imaging elements are arranged to satisfy a Scheimpflug condition so that a plane parallel to a stage surface of the stage becomes a focal plane, for imaging from above the substrate from the same side as the mounting tool with respect to the stage surface; and a bottom-view imaging unit for imaging from below the mounting body that is in a state of being held by the mounting tool from a side opposite to the top-view imaging units with respect to the stage surface, the mounting method comprising:

a calibration control step of calculating calibration values for calibrating a difference between coordinate values calculated based on top-view images output by the top-view imaging units and coordinate values calculated based on a bottom-view image output by the bottom-view imaging unit, based on the top-view images output by the top-view imaging units by imaging a preset calibration index and the bottom-view image output by the bottom-view imaging unit by imaging the calibration index; and a mounting control step of recognizing a reference position of the mounting body based on the bottom-view image output by the bottom-view imaging unit by imaging the mounting body held by the mounting tool, and causing the mounting tool to place and mount the mounting body on the substrate so that the reference position coincides with a target position determined based on the top-view images output by the top-view imaging units by imaging the substrate and the calibration values.

10. A non-transient computer-readable recording medium, recording a mounting control program for controlling a mounting apparatus, which comprises a mounting tool picking up and holding a mounting body and placing and mounting the mounting body on a substrate placed on a stage; top-view imaging units in which respective optical systems and imaging elements are arranged to satisfy a Scheimpflug condition so that a plane parallel to a stage surface of the stage becomes a focal plane, for imaging from above the substrate from the same side as the mounting tool with respect to the stage surface; and a bottom-view imaging unit for imaging from below the mounting body that is in a state of being held by the mounting tool from a side opposite to the top-view imaging units with respect to the stage surface, the mounting control program causing a computer to execute:

a calibration control step of calculating calibration values for calibrating a difference between coordinate values calculated based on top-view images output by the top-view imaging units and coordinate values calculated based on a bottom-view image output by the bottom-view imaging unit, based on the top-view images output by the top-view imaging units by imaging a preset calibration index and the bottom-view image output by the bottom-view imaging unit by imaging the calibration index; and a mounting control step of recognizing a reference position of the mounting body based on the bottom-view image output by the bottom-view imaging unit by imaging the mounting body held by the mounting tool, and causing the mounting tool to place and mount the mounting body on the substrate so that the reference position coincides with a target position determined based on the top-view images output by the top-view imaging units by imaging the substrate and the calibration values.

* * * * *